United States Patent
Heo et al.

(10) Patent No.: US 9,436,098 B2
(45) Date of Patent: Sep. 6, 2016

(54) MASKLESS EXPOSURE DEVICE, MASKLESS EXPOSURE METHOD AND DISPLAY SUBSTRATE MANUFACTURED BY THE MASKLESS EXPOSURE DEVICE AND THE MASKLESS EXPOSURE METHOD

(71) Applicant: SAMSUNG DISPLAY CO., LTD., Yongin, Gyeonggi-do (KR)

(72) Inventors: Jung-Chul Heo, Seoul (KR); Hi-Kuk Lee, Gyeonggi-do (KR); Jae-Hyuk Chang, Gyeonggi-do (KR); Sang-Hyun Lee, Gyeonggi-do (KR); Jung-In Park, Seoul (KR); Sang-Hyun Yun, Gyeonggi-do (KR); Ki-Beom Lee, Seoul (KR); Hyun-Seok Kim, Gyeonggi-do (KR); Kab-Jong Seo, Seoul (KR); Jun-Ho Sim, Gyeonggi-do (KR); Byoung-Min Yun, Gyeonggi-do (KR); Sang-Don Jang, Gyeonggi-do (KR); Jae-Young Jang, Gyeonggi-do (KR); Chang-Hoon Kim, Chungcheongnam-do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/635,339

(22) Filed: Mar. 2, 2015

(65) Prior Publication Data
US 2016/0077449 A1   Mar. 17, 2016

(30) Foreign Application Priority Data

Sep. 12, 2014 (KR) ........................ 10-2014-0121017

(51) Int. Cl.
*G03F 7/20* (2006.01)
*H01L 29/786* (2006.01)
*H01L 27/12* (2006.01)

(52) U.S. Cl.
CPC ......... *G03F 7/70508* (2013.01); *G03F 7/2022* (2013.01); *G03F 7/2051* (2013.01); *G03F 7/702* (2013.01); *G03F 7/70291* (2013.01); *G03F 7/70391* (2013.01); *H01L 27/124* (2013.01); *H01L 27/1222* (2013.01); *H01L 27/1259* (2013.01); *H01L 29/78669* (2013.01); *H01L 29/78693* (2013.01); *H01L 29/78696* (2013.01)

(58) Field of Classification Search
None
See application file for complete search history.

(56) References Cited

U.S. PATENT DOCUMENTS

| 8,574,971 B2 | 11/2013 | Yun et al. |
| 2001/0028993 A1* | 10/2001 | Sanford ................ G02B 26/02 430/313 |

(Continued)

FOREIGN PATENT DOCUMENTS

| KR | 1020080032290 | 4/2008 |
| KR | 1020110106081 | 9/2011 |
| KR | 1020140059099 | 5/2014 |

*Primary Examiner* — Minh-Loan Tran
(74) *Attorney, Agent, or Firm* — F. Chau & Associates, LLC

(57) ABSTRACT

A maskless exposure device includes an exposure head including a digital micro-mirror device. The digital micro-mirror device is configured to transmit a source beam applied from an exposure source to a substrate. A system control part is configured to control the digital micro-mirror device by using a graphic data system file. The graphic data system file includes data for forming a source electrode, a drain electrode and a channel portion disposed between the source electrode and the drain electrode. The graphic system file includes data for forming the channel portion extending in a diagonal direction with respect to a scan direction of the exposure head.

14 Claims, 15 Drawing Sheets

(56) References Cited

U.S. PATENT DOCUMENTS

| | | | |
|---|---|---|---|
| 2011/0267594 A1* | 11/2011 | Kim | G03F 7/2051 355/67 |
| 2014/0186595 A1* | 7/2014 | Yun | G03F 7/2022 428/201 |
| 2016/0109809 A1* | 4/2016 | Lee | G03F 7/70083 355/67 |

* cited by examiner

MASKLESS EXPOSURE DEVICE, MASKLESS EXPOSURE METHOD AND DISPLAY SUBSTRATE MANUFACTURED BY THE MASKLESS EXPOSURE DEVICE AND THE MASKLESS EXPOSURE METHOD

CROSS-REFERENCE TO RELATED APPLICATION

This application claims priority under 35 U.S.C. §119 to Korean Patent Application No. 10-2014-0121017, filed on Sep. 12, 2014 in the Korean Intellectual Property Office (KIPO), the disclosure of which is incorporated by reference herein in its entirety.

TECHNICAL FIELD

Exemplary embodiments of the present inventive concept relate to a maskless exposure device, and more particularly to a maskless exposure method and a display substrate manufactured by the maskless exposure device and the maskless exposure method.

DISCUSSION OF RELATED ART

In general, to form a metal pattern including a thin film transistor ("TFT") and signal lines of a display substrate, a metal layer and a photoresist layer are sequentially formed, and a mask corresponding to the metal pattern is disposed on the photoresist layer.

Then, light is irradiated onto an upper surface of the mask so that the photoresist layer is exposed and developed. Thus, a photoresist pattern corresponding to the mask is formed. The metal layer is etched to form the metal pattern. When the metal layer is etched, the photoresist pattern functions as an etch stopping layer.

The display substrate may have a plurality of metal patterns, each having different shapes from each other. In this case, a plurality of masks corresponding to the number of different metal patterns are used. In addition, when the shape of the metal pattern is changed, the shape of the mask is changed and thus a new mask is fabricated. This can lead to an increase in the manufacturing cost of the display substrate.

In view of the above, a maskless exposure device, which works by providing a plurality of beams of light to a substrate has been used. In the maskless exposure device, the beams of light are selectively provided to the substrate. Thus, a desired photoresist pattern may be formed on the substrate.

However, each beam of light may have a different optical character, such as a size of the beam, a position of beam and/or an intensity of beam. Thus, a wiring that is formed this way might not have a uniform shape. Accordingly, defects, such as a stain on the display panel may result.

SUMMARY

Exemplary embodiments of the present inventive concept provide a maskless exposure device which can reduce the occurrence of display panel defects.

Exemplary embodiments of the present inventive concept provide a maskless exposure method which can reduce the occurrence of display panel defects.

Exemplary embodiments of the present inventive concept provide a display substrate manufactured by the maskless exposure device and the maskless exposure method.

In an exemplary embodiment of a maskless exposure device according to the present inventive concept, the maskless exposure device includes an exposure head including a digital micro-mirror device. The digital micro-mirror device is configured to transmit a source beam applied from an exposure source to a substrate. A system control part is configured to control the digital micro-mirror device by using a graphic data system file. The graphic data system file includes data for forming a source electrode, a drain electrode and a channel portion disposed between the source electrode and the drain electrode. The graphic data system file includes data for forming the channel portion extending in a diagonal direction with respect to a scan direction of the exposure head.

In an exemplary embodiment, the channel portion may have a "U" shape in a plan view.

In an exemplary embodiment, the channel portion may include a first extension portion extending in the diagonal direction with respect to the scan direction of the exposure head, a second extension portion bent from the first extension portion and extending in the diagonal direction with respect to the scan direction of the exposure head and a connecting portion connecting the first extension portion and the second extension portion.

In an exemplary embodiment, the first extension portion may be parallel with the second extension portion.

In an exemplary embodiment, the first extension portion may be inclined at a first angle with respect to the scan direction of the exposure and the second extension portion may be inclined at a second angle with respect to the scan direction of the exposure head. The second angle may be different from the first angle.

In an exemplary embodiment, the channel portion may have a "V" shape in a plan view.

In an exemplary embodiment, the system control part may include a file producing part configured to produce the graphic data system file corresponding to a pattern to be formed on the substrate. A data outputting part may be configured to generate digital micro-mirror device on/off data from the graphic data system file to control on/off timing of the digital micro-mirror device. A transfer control part may be configured to output a transfer signal. The transfer signal may transfer a stage configured to fix the substrate thereto.

In an exemplary embodiment, the transfer control part may control on/off timing of the exposure beam in response to the digital micro-mirror device on/off data supplied from the data outputting part, and may transfer the stage.

In an exemplary embodiment of a method of maskless exposure according to the present inventive concept, the method includes producing a graphic data system file for forming a pattern on a substrate, generating digital micro-mirror device on/off data from the graphic data system file and exposing the substrate in response to the digital micro-mirror device on/off data. The graphic data system file includes data for forming a source electrode, a drain electrode and a channel portion disposed between the source electrode and the drain electrode. The channel portion extends in a diagonal direction with respect to a scan direction of the exposure head.

In an exemplary embodiment, the channel portion may have a "U" shape in a plan view.

In an exemplary embodiment, the channel portion may include a first extension portion extending in the diagonal direction with respect to the scan direction of the exposure head, a second extension portion bent from the first extension portion and extending in the diagonal direction with respect to the scan direction of the exposure head and a connecting portion connecting the first extension portion and the second extension portion.

In an exemplary embodiment, wherein the first extension portion may be parallel with the second extension portion.

In an exemplary embodiment, the first extension portion may be inclined at a first angle with respect to the scan direction of the exposure head and the second extension portion may be inclined at a second angle with respect to the scan direction of the exposure head. The second angle may be different from the first angle.

In an exemplary embodiment, the channel portion may have a "V" shape in a plan view.

In an exemplary embodiment of a display substrate according to the present inventive concept, the display substrate includes a gate line extending in a first direction, a data line extending in a second direction crossing the first direction and a switching element comprising a gate electrode electrically connected with the gate line, a source electrode electrically connected with the data line, a drain electrode spaced apart from the source electrode and a channel portion disposed between the source electrode and the drain electrode. The channel portion extends in a diagonal direction with respect to the first direction.

In an exemplary embodiment, the channel portion may have a "U" shape in a plan view.

In an exemplary embodiment, the channel portion may include a first extension portion extending in the diagonal direction with respect to the first direction, a second extension portion bent from the first extension portion and extending in the diagonal direction with respect to the first direction and a connecting portion connecting the first extension portion and the second extension portion.

In an exemplary embodiment, the first extension portion may be parallel with the second extension portion.

In an exemplary embodiment, the first extension portion may be inclined at a first angle with respect to the first direction and the second extension portion may be inclined at a second angle with respect to the first direction. The second angle may be different from the first angle.

In an exemplary embodiment, the channel portion may have a "V" shape in a plan view.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be described in more detail with reference to the accompanying drawings.

Figure 1:
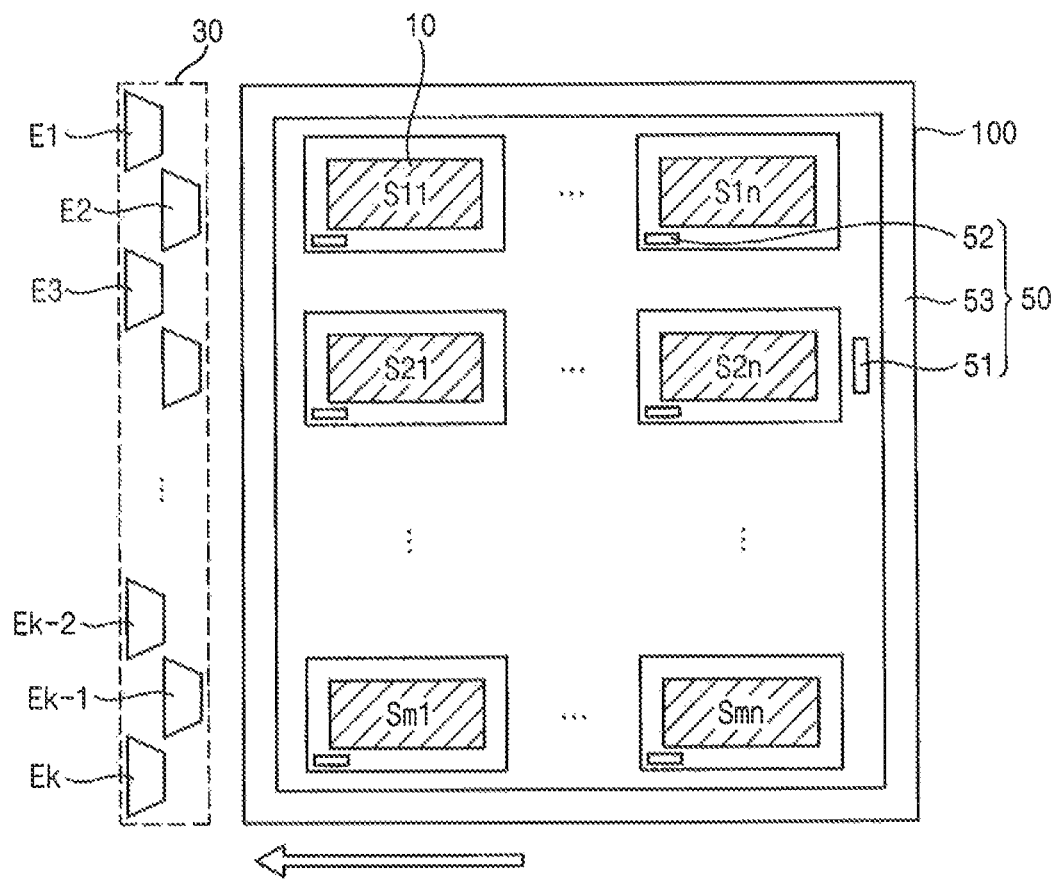
FIG. 1 is a plan view illustrating a maskless exposure device according to an exemplary embodiment of the present inventive concept.

FIG. 1 is a plan view illustrating a maskless exposure device according to an exemplary embodiment of the present inventive concept.

Referring to FIG. 1, a substrate 100 may be a main substrate for forming a display panel. The substrate 100 may include a plurality of first areas 10 and a plurality of second areas 50. A plurality of display panels S11, . . . , Smn may be disposed in a matrix shape with one display panel formed in each first area 10. According to an exemplary embodiment of the present inventive concept, 'm' and 'n' may be natural numbers. The second areas 50 may include glass ID areas 51 where an identification number for the substrate 100 may be disposed, and cell ID areas 52 where an identification number for the display panels may be disposed. The second areas 50 may include an edge exposure area 53 that is disposed in an edge portion of the substrate 100.

The substrate 100 may be transferred to an area below an exposure part 30 along a first direction where the substrate 100 may be exposed. The substrate 100 may be transferred to the exposure part 30 by a stage (not shown) disposed below the substrate 100.

To expose the substrate 100, a step exposing method or a scan exposing method may be employed. In a step exposing method, the substrate 100 may be transferred and stopped repeatedly during exposing. In a scan exposing method, the substrate 100 may be continuously transferred during exposing. For example, an island pattern may be formed through the step exposing method, and a strip pattern may be formed through the scan exposing method.

The exposure part 30 may include a plurality of exposure heads E1, E2, E3, . . . , Ek-2, Ek-1 and Ek. The exposure heads E1, E2, E3, . . . , Ek-2, Ek-1 and Ek may be disposed along a second direction substantially perpendicular to the first direction. According to an exemplary embodiment of the present inventive concept, 'k' may be a natural number.

For example, the exposure heads E1, E2, E3, . . . , Ek-2, Ek-1 and Ek may be disposed in two rows. The exposure heads of a first row and the exposure heads of a second row may be alternately disposed along the second direction. Although not shown in FIG. 1, the exposure heads E1, E2, E3, . . . , Ek-2, Ek-1 and Ek may have various arrangements in the second direction.

The exposure part 30 may expose the substrate 100 being transferred along the first direction, so that an exposure pattern may be formed in a direction opposite to the first direction.

The exposure heads E1, E2, E3, . . . , Ek-2, Ek-1 and Ek may include a digital micro-mirror device ("DMD"). The DMD may radiate an exposure beam in response to an on/off data signal. A source beam from a digital mirror of a cell of the DMD may be reflected to generate the exposure beam, and the exposure beam may exit from the exposure heads E1, E2, E3, . . . , Ek-2, Ek-1 and Ek.

Figure 2:
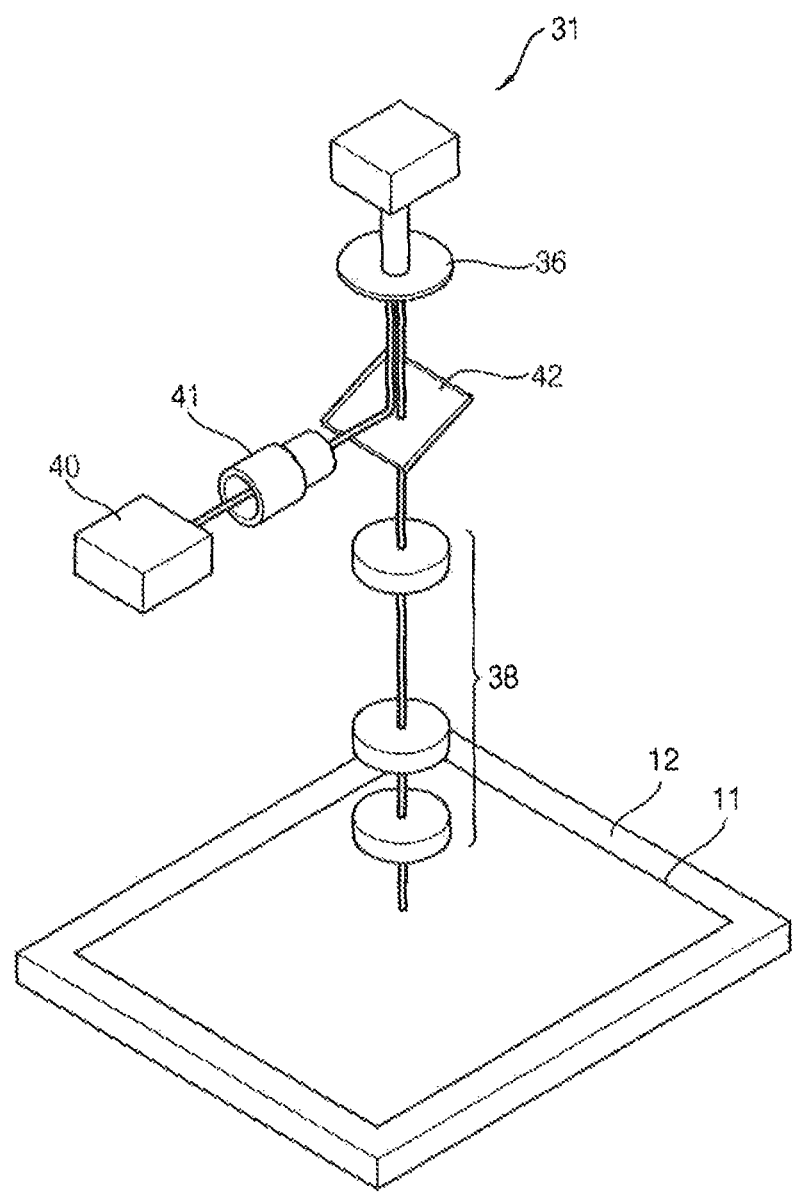
FIG. 2 is a perspective view illustrating an exposure head according to an exemplary embodiment of the exposure device of FIG. 1 according to an exemplary embodiment of the present inventive concept.

FIG. 2 is a perspective view illustrating an exposure head according to an exemplary embodiment of the exposure device of FIG. 1.

Referring to FIGS. 1 and 2, the exposure head 31 may include the DMD 36. The DMD 36 may be irradiated with the source beam emitted from an exposure source 40. The source beam emitted from the exposure source 40 may pass through a lens 41 and may be reflected by a mirror 42. The source beam may be an ultraviolet (UV) ray for exposing a photoresist film 11. The photoresist film 11 may be disposed on a target substrate 12 corresponding to an object to be exposed. When a pattern is formed on the substrate, the photoresist film 11 may be used as a mask to form the pattern. The photoresist film 11 may be formed by coating a photosensitive resin such as an epoxy resin on a surface of a glass substrate. The DMD 36 may selectively reflect the source beam for each pixel based on image data transferred onto the target substrate 12.

The exposure head 31 may include a projection optical device 38. The projection optical device 38 may include a plurality of lenses, and may convert light selectively reflected from the DMD 36 into the exposure beam.

Figure 3:
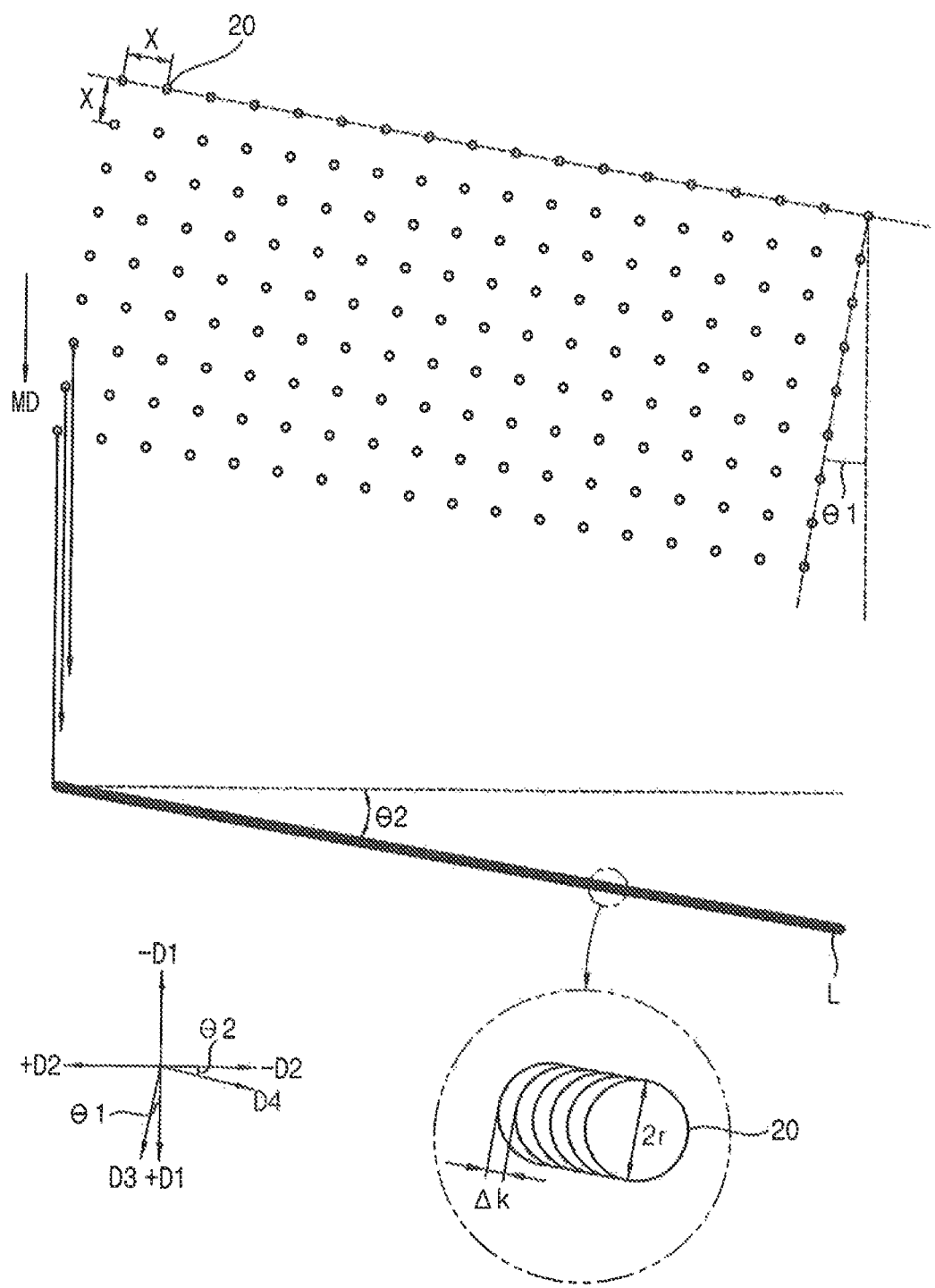
FIG. 3 is a plan view illustrating an exposure step using an exposure head in FIG. 1 according to an exemplary embodiment of the present inventive concept.

FIG. 3 is a plan view illustrating an exposure step using an exposure head in FIG. 1 according to an exemplary embodiment of the present inventive concept.

Referring to FIG. 3, a maskless exposure device according to an exemplary embodiment of the present inventive concept may be inclined by a first angle $é_1$ with respect to a side of the substrate extending in a first direction +D1 and −D1. When a second direction +D2 and −D2 defines a direction substantially perpendicular to the first direction +D1 and −D1, an inclined direction of the maskless exposure device may be between the first direction +D1 and −D1 and the second direction +D2 and −D2. Hereinafter, the first direction +D1 and −D1 may be divided into a positive first direction +D1 and a negative first direction −D1, and the second direction +D2 and −D2 may be divided into a positive second direction +D2 and a negative second direction −D2.

The inclined direction of the maskless exposure device may be a third direction D3 between the positive first direction +D1 and the positive second direction +D2. The first angle $é_1$ may be an acute angle clockwise rotated with respect to a reference line extending in the first direction +D1 and −D1. For example, the first angle $é_1$ may be between about 0.1° and about 0.5°.

The maskless exposure device inclined with respect to the third direction D3 may provide spot beams 20 onto the substrate along a scanning direction MD. The scanning direction MD may be substantially the same as the first positive direction +D1. When the first angle $é_1$ of the maskless exposure device is about 0° and the maskless exposure device exposes the substrate along the positive first direction +D1, a region of the substrate between adjacent spot beams 20 might not be exposed. Therefore, to entirely expose a predetermined region, the maskless exposure device inclined with respect to the substrate by the first angle $é_1$ may emit light onto the substrate.

When micro-mirrors receive activated data and the spot beams 20 are irradiated onto the substrate which may be stopped, the spot beams 20 may be spaced apart from each other in the third direction D3 by a predetermined distance "x." The spot beams 20 may be spaced apart from each other in a direction substantially perpendicular to the third direction D3 by the determined distance "x."

In order to selectively expose a predetermined region of the substrate, for example, a pattern-formed region L, the spot beams 20 may be selectively irradiated in the pattern-formed region L. According to an exemplary embodiment of the present inventive concept, the pattern-formed region L may be defined as a region extending along a fourth direction D4 inclined in a clockwise direction with respect to a side of the substrate by a second angle $é_2$. The pattern-formed region L may have a rectangular shape extending in the fourth direction D4. An operator may give the pattern-formed region L its rectangular shape. When the maskless exposure device entirely exposes the pattern-formed region L, the spot beams 20 with a circular shape having a diameter "2r" may overlap with each other by a predetermined distance "Äk" in the pattern-formed region L so that the substrate of the pattern-formed region L is entirely exposed.

Figure 4:
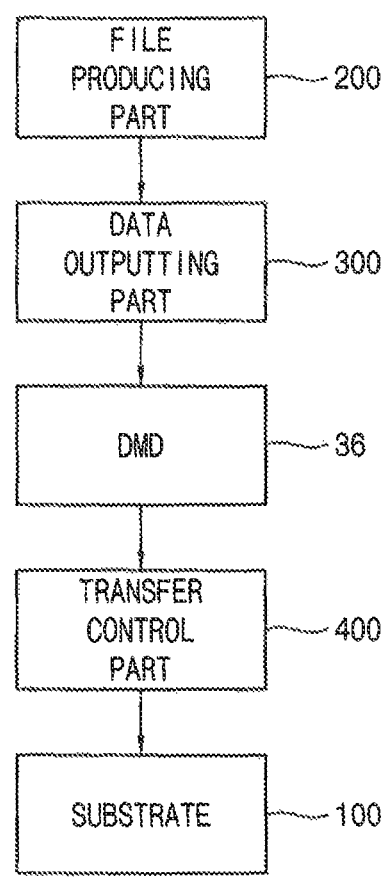
FIG. 4 is a block diagram of a system control part according to an exemplary embodiment of the maskless exposure device of FIG. 1 according to an exemplary embodiment of the present inventive concept.

FIG. 4 is a block diagram of a system control part according to an exemplary embodiment of the maskless exposure device of FIG. 1 according to an exemplary embodiment of the present inventive concept.

Referring to FIGS. 1 and 4, the system control part may include a file producing part 200, a data outputting part 300 and a transfer control part 400.

The file producing part 200 may produce a graphic data system ("GDS") file. The GDS file may be an inverse of a multilayered computer-aided design ("CAD") file. For example, the GDS file may includes data for each layer such as a gate pattern, an active pattern, and/or source drain patterns.

The data outputting part 300 may generate the digital micro-mirror device on/off data from the graphic data system GDS file.

The data outputting part 300 may output the digital micro-mirror device on/off data to the digital micro-mirror device 36.

The transfer control part 400 may output a transfer signal which may transfer the stage (not shown). The transfer control part 400 may control on/off timing of the exposure beam in response to a DMD on/off data supplied from the data outputting part 300, and may transfer the stage.

The maskless exposure device according to an exemplary embodiment of the present inventive concept may form a display substrate 100 by using a manufacturing method including producing a graphic data system file respectively corresponding to each of a plurality of patterns to be formed on a substrate, generating a digital micro-mirror device on/off data from the graphic data system files to control on/off timing of the digital micro-mirror device and exposing the substrate according to the digital micro-mirror device on/off data.

The DMD on/off data may be generated by the GDS file in the data outputting part 300. An on/off file for generating the DMD on/off data may be configured by '1's and '0's in a binary file. According to an exemplary embodiment of the present inventive concept, when the on/off data is '1', the DMD may be turned on so that light is emitted to the substrate 100. When the on/off data is '0', the DMD may be turned off so that light is not emitted to the substrate 100.

The DMD may selectively reflect the light based on the DMD on/off data to expose the substrate 100 according to the data of the patterns stored in the GDS file. Therefore, the substrate 100 having the patterns may be formed.

Figure 5:
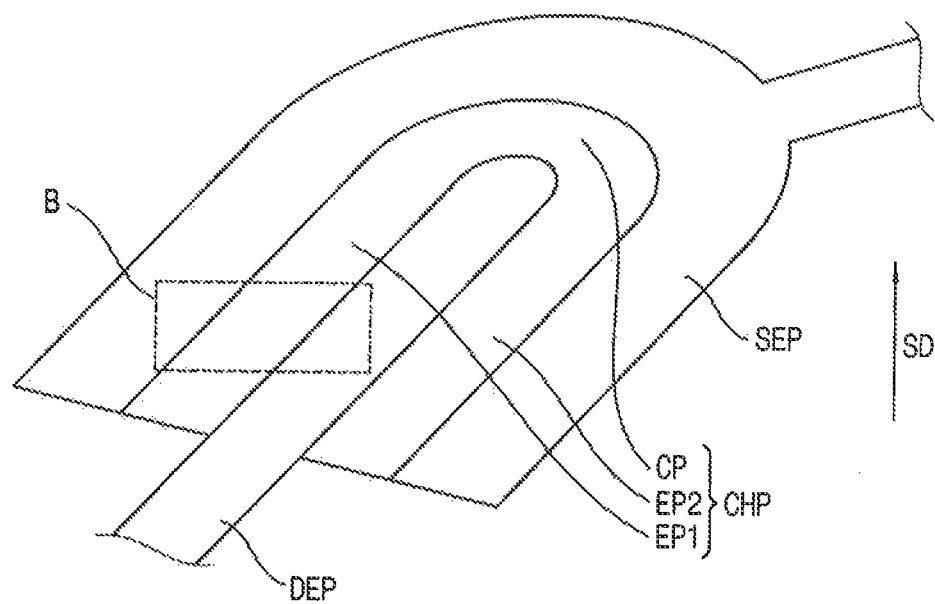
FIG. 5 is a plan view illustrating a source electrode, a drain electrode and a channel portion of a graphic data system file used for a digital micro-mirror device and exposure head according to an exemplary embodiment of the present inventive concept.

FIG. 5 is a plan view illustrating a source electrode, a drain electrode and a channel portion of a graphic data system file used for a digital micro-mirror device and exposure head according to an exemplary embodiment of the present inventive concept.

Referring to FIG. 5, a source electrode pattern SEP, a drain electrode pattern DEP and a channel portion pattern CHP of a graphic data system file used for a digital micro-mirror device and exposure head according to an exemplary embodiment of the present inventive concept are illustrated.

The source electrode pattern SEP may be spaced apart from the drain electrode pattern DEP. A space between the source electrode pattern SEP and the drain electrode pattern DEP may define the channel portion pattern CHP.

The source electrode pattern SEP may have a "U" shape in a plan view. The drain electrode pattern DEP may be disposed between portions of the electrode pattern SEP in a plan view. The drain electrode pattern DEP may extend in a diagonal direction with respect to a scan direction SD of the exposure head. The channel portion pattern CHP may have a shape corresponding to a shape of the source electrode pattern SEP. Thus, the channel portion pattern CHP may have a "U" shape in a plan view.

The channel portion pattern CHP may include a first extension portion EP1, a second extension portion EP2 and a connecting portion CP. The first extension portion EP1 may extend in a diagonal direction with respect to the scan direction SD of the exposure head. The second extension portion EP2 may be bent from the first extension portion EP1. The second extension portion EP2 may extend in a diagonal direction with respect to the scan direction SD of the exposure head. The connecting portion CP may connect the first extension portion EP1 and the second extension portion EP2.

According to an exemplary embodiment of the present inventive concept, the first extension portion EP1 may be parallel with the second extension portion EP2. The connecting portion CP may have a half-circular shape.

A shape of patterns formed by the maskless exposure device may be affected by various factors. The number of beams exposing a pattern extending in a direction parallel with the scan direction SD of the exposure head may be fixed for forming a single pattern. However, although a plurality of patterns may have the same width, the number of beams exposing the pattern extending in the direction parallel with the scan direction SD of the exposure head may be different.

When the number of beams exposing the pattern extending in the direction parallel with the scan direction SD of the exposure head is insufficient, the number of beams exposing the pattern extending in the direction parallel with the scan direction SD of the exposure head may be insufficient across the whole pattern. When the number of beams exposing the pattern is insufficient, an amount of exposure may be insufficient. Accordingly, when the amount of exposure is insufficient, a short may occur between a source electrode and a drain electrode in a channel portion along the scan direction SD of the exposure head.

According to an exemplary embodiment of the present inventive concept, the channel portion pattern CHP may extend in a diagonal direction with respect to the scan direction SD of the exposure head. Thus, the number of beams exposing the pattern extending in the diagonal direction with respect to the scan direction SD of the exposure head might not be fixed for forming a single pattern. In other words, the number of beams exposing the pattern extending in the diagonal direction with respect to the scan direction SD of the exposure head may be different according to a section of the pattern. Accordingly, the number of beams exposing the pattern extending in the diagonal direction with respect to the scan direction SD of the exposure head is not insufficient. When the number of beams exposing the pattern is not insufficient, the amount of exposure is not insufficient. Therefore, an occurrence of a short between the source electrode and the drain electrode may be reduced or prevented.

Figure 6:
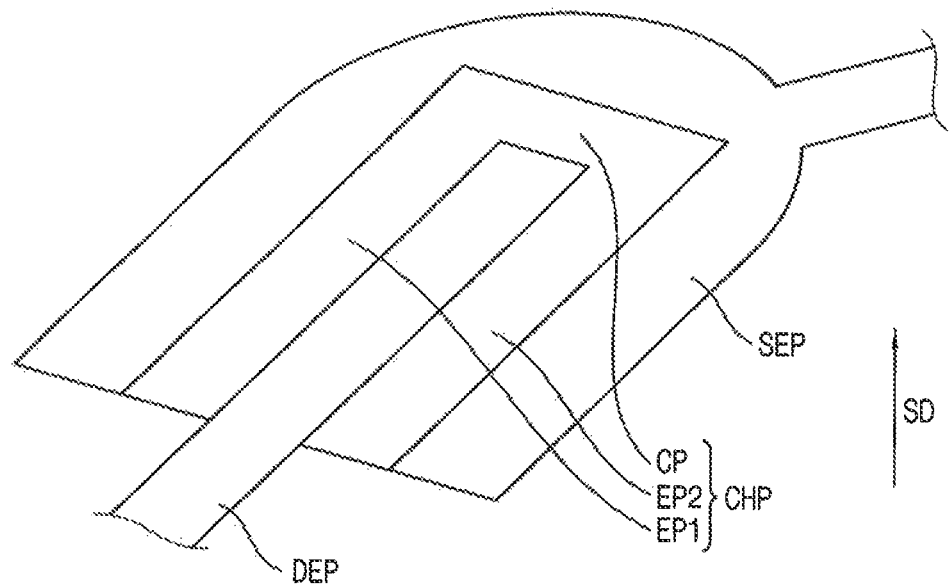
FIG. 6 is a plan view illustrating a source electrode, a drain electrode and a channel portion of a graphic data system file used for a digital micro-mirror device and exposure head according to an exemplary embodiment of the present inventive concept.

FIG. 6 is a plan view illustrating a source electrode, a drain electrode and a channel portion of a graphic data system file used for a digital micro-mirror device and exposure head according to an exemplary embodiment of the present inventive concept.

Referring to FIG. 6, the source electrode pattern SEP, the drain electrode pattern DEP and the channel portion pattern CHP of the graphic data system file used for the digital micro-mirror device and exposure head according to an exemplary embodiment of the present inventive concept are illustrated.

The source electrode pattern SEP may be spaced apart from the drain electrode pattern DEP. A space between the source electrode pattern SEP and the drain electrode pattern DEP may define the channel portion pattern CHP.

The source electrode pattern SEP may have a "U" shape in a plan view. The drain electrode pattern DEP may be disposed between portion of the electrode pattern SEP in a plan view. The drain electrode pattern DEP may extend in a diagonal direction with respect to the scan direction SD of the exposure head. The channel portion pattern CHP may have a shape corresponding to a shape of the source electrode pattern SEP. Thus, the channel portion pattern CHP may have a "U" shape in a plan view.

The channel portion pattern CHP may include the first extension portion EP1, the second extension portion EP2 and the connecting portion CP. The first extension portion EP1 may extend in the diagonal direction with respect to the scan direction SD of the exposure head. The second extension portion EP2 may be bent from the first extension portion EP1. The second extension portion EP2 may extend in the diagonal direction with respect to the scan direction SD of the exposure head. The connecting portion CP may connect between the first extension portion EP1 and the second extension portion EP2.

According to an exemplary embodiment of the present inventive concept, the first extension portion EP1 may be parallel with the second extension portion EP2. The connecting portion CP may have a rectangular shape.

A shape of patterns formed by the maskless exposure device may be affected by various factors. The number of beams exposing the pattern extending in the direction parallel with the scan direction SD of the exposure head may be fixed for forming a single pattern. However, although a plurality of patterns may have the same width, the number of beams exposing the pattern extending in the direction parallel with the scan direction SD of the exposure head may be different.

When the number of beams exposing the pattern extending in the direction parallel with the scan direction SD of the exposure head is insufficient, the number of beams exposing the pattern extending in the direction parallel with the scan direction SD of the exposure head may be insufficient across the whole pattern. When the number of beams exposing the pattern is insufficient, an amount of exposure may be insufficient. Accordingly, when the amount of exposure is insufficient, a short may occur between the source electrode and the drain electrode in the channel portion along the scan direction SD of the exposure head.

According to an exemplary embodiment of the present inventive concept, the channel portion pattern CHP may extend in the diagonal direction with respect to the scan direction SD of the exposure head. Thus, the number of beams exposing the pattern extending in the diagonal direction with respect to the scan direction SD of the exposure head might not be fixed for forming a single pattern. In other words, the number of beams exposing the pattern extending in the diagonal direction with respect to the scan direction SD of the exposure head may be different according to a section of the pattern. Accordingly, the number of beams exposing the pattern extending in the diagonal direction with respect to the scan direction SD of the exposure head is not insufficient on the whole. When the number of beams exposing the pattern is not insufficient, the amount of exposure is not insufficient. Therefore, an occurrence of a short between the source electrode and the drain electrode may be reduced or prevented.

Figure 7:
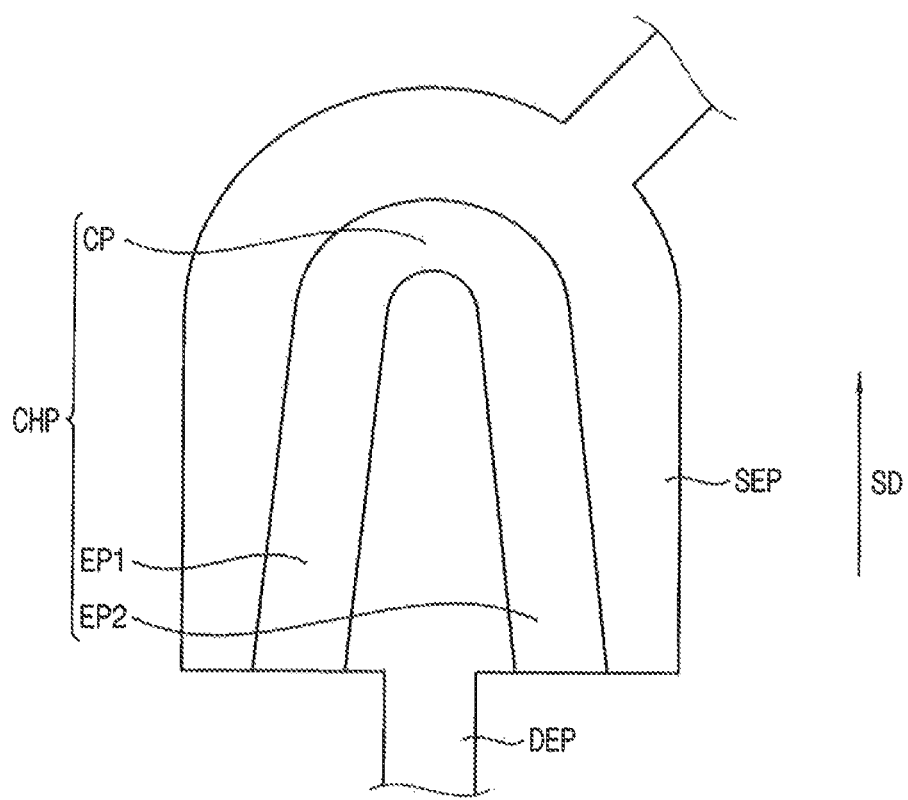
FIG. 7 is a plan view illustrating a source electrode, a drain electrode and a channel portion of a graphic data system file used for a digital micro-mirror device and exposure head according to an exemplary embodiment of the present inventive concept.

FIG. 7 is a plan view illustrating a source electrode, a drain electrode and a channel portion of a graphic data system file used for a digital micro-mirror device and exposure head according to an exemplary embodiment of the present inventive concept.

Referring to FIG. 7, the source electrode pattern SEP, the drain electrode pattern DEP and the channel portion pattern CHP of the graphic data system file used for the digital micro-mirror device and exposure head according to an exemplary embodiment of the present inventive concept are illustrated.

The source electrode pattern SEP may be spaced apart from the drain electrode pattern DEP. The space between the source electrode pattern SEP and the drain electrode pattern DEP may be defined by the channel portion pattern CHP.

The source electrode pattern SEP may have a "U" shape in a plan view. The drain electrode pattern DEP may be disposed between the electrode pattern SEP in a plan view. The channel portion pattern CHP may have a shape corresponding to a shape of the source electrode pattern SEP. Thus, the channel portion pattern CHP may have a "U" shape in a plan view.

The channel portion pattern CHP may include the first extension portion EP1, the second extension portion EP2 and the connecting portion CP. The first extension portion EP1 may extend in the diagonal direction with respect to the scan direction SD of the exposure head. The second extension portion EP2 may be bent from the first extension portion EP1. The second extension portion EP2 may extend in the diagonal direction with respect to the scan direction SD of the exposure head. The connecting portion CP may connect the first extension portion EP1 and the second extension portion EP2.

According to an exemplary embodiment of the present inventive concept, the first extension portion EP1 may be not parallel with the second extension portion EP2. For example, the first extension portion EP1 and the second extension portion EP2 may be inclined at different angles with respect to the scan direction SD of the exposure head respectively. The connecting portion CP may have a half-circular shape.

A shape of patterns formed by the maskless exposure device may be affected by various factors. The number of beams exposing the pattern extending in the direction parallel with the scan direction SD of the exposure head may be fixed for forming a single pattern. However, although a plurality of patterns may have the same width, the number of beams exposing the pattern extending in the direction parallel with the scan direction SD of the exposure head may be different.

When the number of beams exposing the pattern extending in the direction parallel with the scan direction SD of the exposure head is insufficient, the number of beams exposing the pattern extending in the direction parallel with the scan direction SD of the exposure head may be insufficient across the whole pattern. When the number of beams exposing the pattern is insufficient, an amount of exposure may be insufficient. Accordingly, when the amount of exposure is insufficient, a short may occur between the source electrode and the drain electrode in the channel portion along the scan direction SD of the exposure head.

According to an exemplary embodiment of the present inventive concept, the channel portion pattern CHP may extend in the diagonal direction with respect to the scan direction SD of the exposure head. Thus, the number of beams exposing the pattern extending in the diagonal direction with respect to the scan direction SD of the exposure head might not be fixed for forming a single pattern. In other words, the number of beams exposing the pattern extending in the diagonal direction with respect to the scan direction SD of the exposure head may be different according to a section of the pattern. Accordingly, the number of beams exposing the pattern extending in the diagonal direction with respect to the scan direction SD of the exposure head is not insufficient on the whole. When the number of beams exposing the pattern is not insufficient, the amount of exposure is not insufficient. Therefore, an occurrence of a short between the source electrode and the drain electrode may be reduced or prevented.

Figure 8:
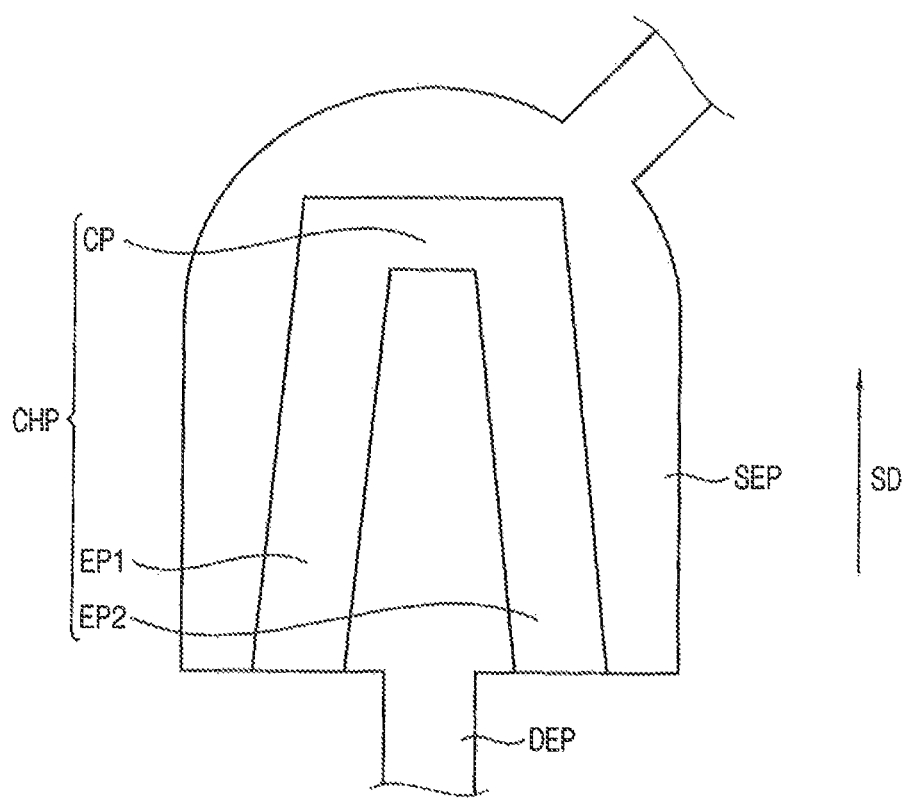
FIG. 8 is a plan view illustrating a source electrode, a drain electrode and a channel portion of a graphic data system file used for a digital micro-mirror device and exposure head according to an exemplary embodiment of the present inventive concept.

FIG. 8 is a plan view illustrating a source electrode, a drain electrode and a channel portion of a graphic data system file used for a digital micro-mirror device and exposure head according to an exemplary embodiment of the present inventive concept.

Referring to FIG. 8, the source electrode pattern SEP, the drain electrode pattern DEP and the channel portion pattern CHP of the graphic data system file used for the digital micro-mirror device and exposure head according to an exemplary embodiment of the present inventive concept are illustrated.

The source electrode pattern SEP may be spaced apart from the drain electrode pattern DEP. A space between the source electrode pattern SEP and the drain electrode pattern DEP may be defined by the channel portion pattern CHP.

The source electrode pattern SEP may have a "U" shape in a plan view. The drain electrode pattern DEP may be disposed between portions of the electrode pattern SEP in a plan view. The channel portion pattern CHP may have a shape corresponding to a shape of the source electrode pattern SEP. Thus, the channel portion pattern CHP may have a "U" shape in a plan view.

The channel portion pattern CHP may include the first extension portion EP1, the second extension portion EP2 and a connecting portion CP. The first extension portion EP1 may extend in the diagonal direction with respect to the scan direction SD of the exposure head. The second extension portion EP2 may be bent from the first extension portion EP1. The second extension portion EP2 may extend in the diagonal direction with respect to the scan direction SD of the exposure head. The connecting portion CP may connect the first extension portion EP1 and the second extension portion EP2.

According to an exemplary embodiment of the present inventive concept, the first extension portion EP1 may be not parallel with the second extension portion EP2. For example, the first extension portion EP1 and the second extension portion EP2 may be inclined at different angles with respect to the scan direction SD of the exposure head, respectively. The connecting portion CP may have a rectangular shape.

A shape of patterns formed by the maskless exposure device may be affected by various factors. The number of beams exposing the pattern extending in the direction parallel to the scan direction SD of the exposure head may be fixed for forming a single pattern. However, although a plurality of patterns may have the same width, the number of beams exposing the pattern extending in the direction parallel with the scan direction SD of the exposure head may be different.

When the number of beams exposing the pattern extending in the direction parallel with the scan direction SD of the exposure head is insufficient, the number of beams exposing the pattern extending in the direction parallel with the scan direction SD of the exposure head may be insufficient across the whole pattern. When the number of beams exposing the pattern is insufficient, an amount of exposure may be insufficient. Accordingly, when the amount of exposure is insufficient, a short may occur between the source electrode and the drain electrode in the channel portion along the scan direction SD of the exposure head.

According to an exemplary embodiment of the present inventive concept, the channel portion pattern CHP may extend in a diagonal direction with respect to the scan direction SD of the exposure head. Thus, the number of beams exposing the pattern extending in the diagonal direction with respect to the scan direction SD of the exposure head might not be fixed for forming a single pattern. In other words, the number of beams exposing the pattern extending in the diagonal direction with respect to the scan direction SD of the exposure head may be different according to a section of the pattern. Accordingly, the number of beams exposing the pattern extending in the diagonal direction with respect to the scan direction SD of the exposure head is not insufficient on the whole. When the number of beams exposing the pattern is not insufficient, the amount of exposure is not insufficient. Therefore, an occurrence of a short between the source electrode and the drain electrode may be reduced or prevented.

Figure 9:
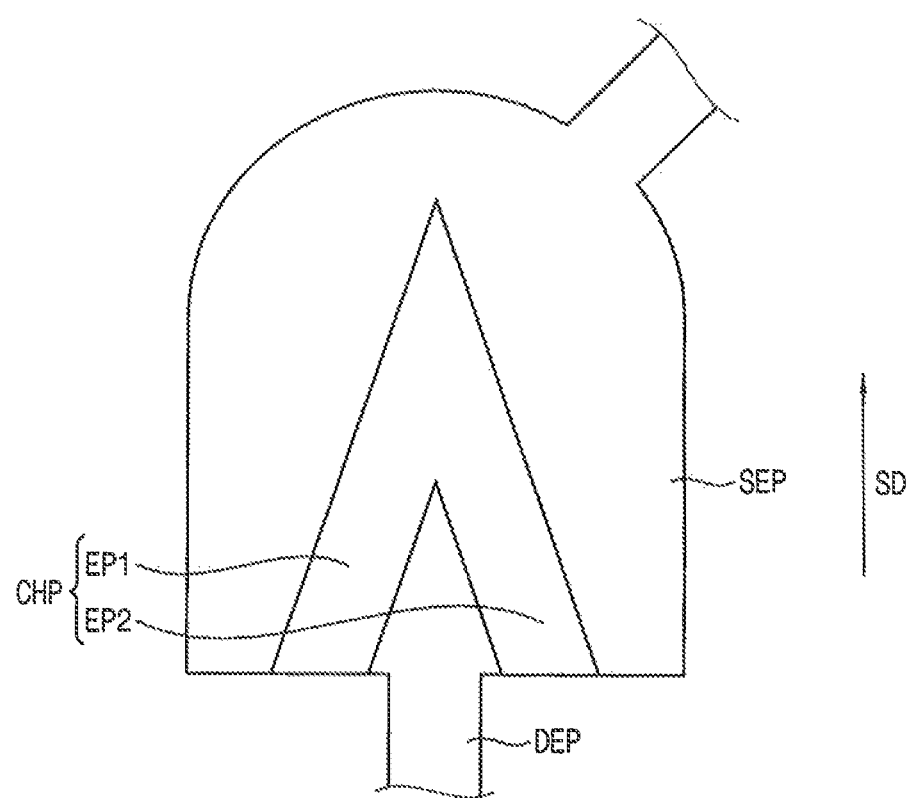
FIG. 9 is a plan view illustrating a source electrode, a drain electrode and a channel portion of a graphic data system file used for a digital micro-mirror device and exposure head according to an exemplary embodiment of the present inventive concept.

FIG. 9 is a plan view illustrating a source electrode, a drain electrode and a channel portion of a graphic data system file used for a digital micro-mirror device and exposure head according to an exemplary embodiment of the present inventive concept.

Referring to FIG. 9, the source electrode pattern SEP, the drain electrode pattern DEP and the channel portion pattern CHP of the graphic data system file used for the digital micro-mirror device and exposure head according to an exemplary embodiment of the present inventive concept are illustrated.

The source electrode pattern SEP may be spaced apart from the drain electrode pattern DEP. A space between the source electrode pattern SEP and the drain electrode pattern DEP may be defined by the channel portion pattern CHP.

The source electrode pattern SEP may have a "V" shape in a plan view. The drain electrode pattern DEP may be disposed between the electrode pattern SEP in a plan view. The channel portion pattern CHP may have a shape corresponding to a shape of the source electrode pattern SEP. Thus, the channel portion pattern CHP may have a "V" shape in a plan view.

The channel portion pattern CHP may include the first extension portion EP1 and the second extension portion EP2. The first extension portion EP1 may extend in the diagonal direction with respect to the scan direction SD of the exposure head. The second extension portion EP2 may be bent from the first extension portion EP1. The second extension portion EP2 may extend in the diagonal direction with respect to the scan direction SD of the exposure head.

According to an exemplary embodiment of the present inventive concept, the first extension portion EP1 may be not parallel with the second extension portion EP2. For example, the first extension portion EP1 and the second extension portion EP2 may be inclined at different angles with respect to the scan direction SD of the exposure head, respectively.

A shape of patterns formed by the maskless exposure device may be affected by various factors. The number of beams exposing the pattern extending in the direction parallel with the scan direction SD of the exposure head may be fixed for forming a single pattern. However, although a plurality of patterns may have the same width, the number of beams exposing the pattern extending in the direction parallel with the scan direction SD of the exposure head may be different.

When the number of beams exposing the pattern extending in the direction parallel with the scan direction SD of the exposure head is insufficient, the number of beams exposing the pattern extending in the direction parallel with the scan direction SD of the exposure head may be insufficient across the whole pattern. When the number of beams exposing the pattern is insufficient, an amount of exposure may be insufficient. Accordingly, when the amount of exposure is insufficient, a short may occur between the source electrode and the drain electrode in the channel portion along the scan direction SD of the exposure head.

According to an exemplary embodiment of the present inventive concept, the channel portion pattern CHP may extend in the diagonal direction with respect to the scan direction SD of the exposure head. Thus, the number of beams exposing the pattern extending in the diagonal direction with respect to the scan direction SD of the exposure head might not be fixed to form a single pattern. In other words, the number of beams exposing the pattern extending in the diagonal direction with respect to the scan direction SD of the exposure head may be different according to a section of the pattern. Accordingly, the number of beams exposing the pattern extending in the diagonal direction with respect to the scan direction SD of the exposure head is not insufficient on the whole. When the number of beams exposing the pattern is not insufficient, an amount of exposure is not insufficient. Therefore, an occurrence of a short between the source electrode and the drain electrode may be reduced or prevented.

Figure 10:
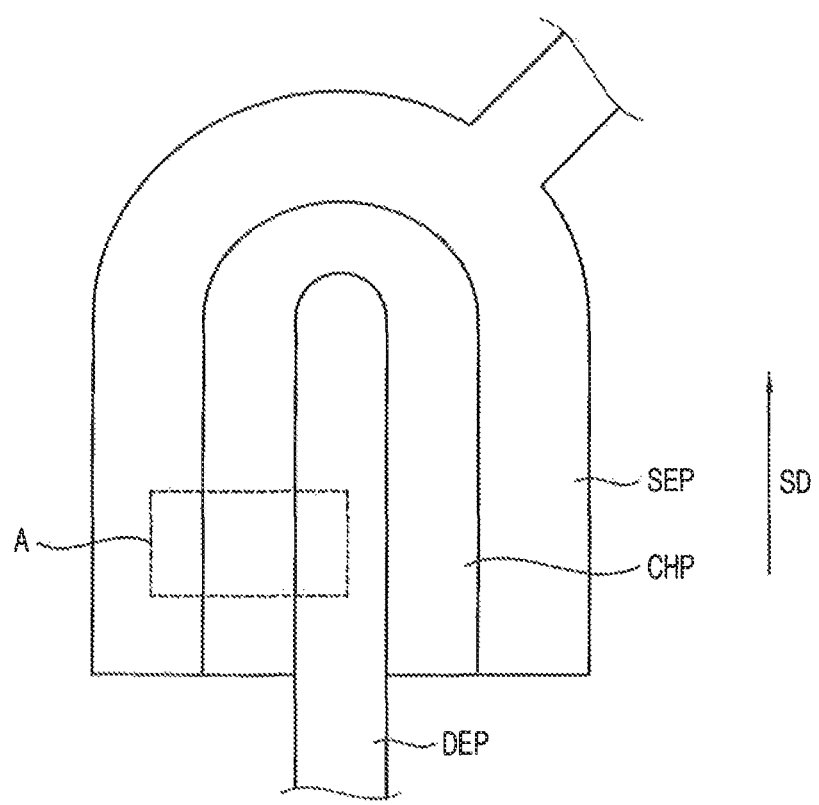
FIG. 10 is a plan view illustrating a source electrode, a drain electrode and a channel portion of a graphic data system file extending in a direction parallel with a scan direction of an exposure head.
Figure 11:
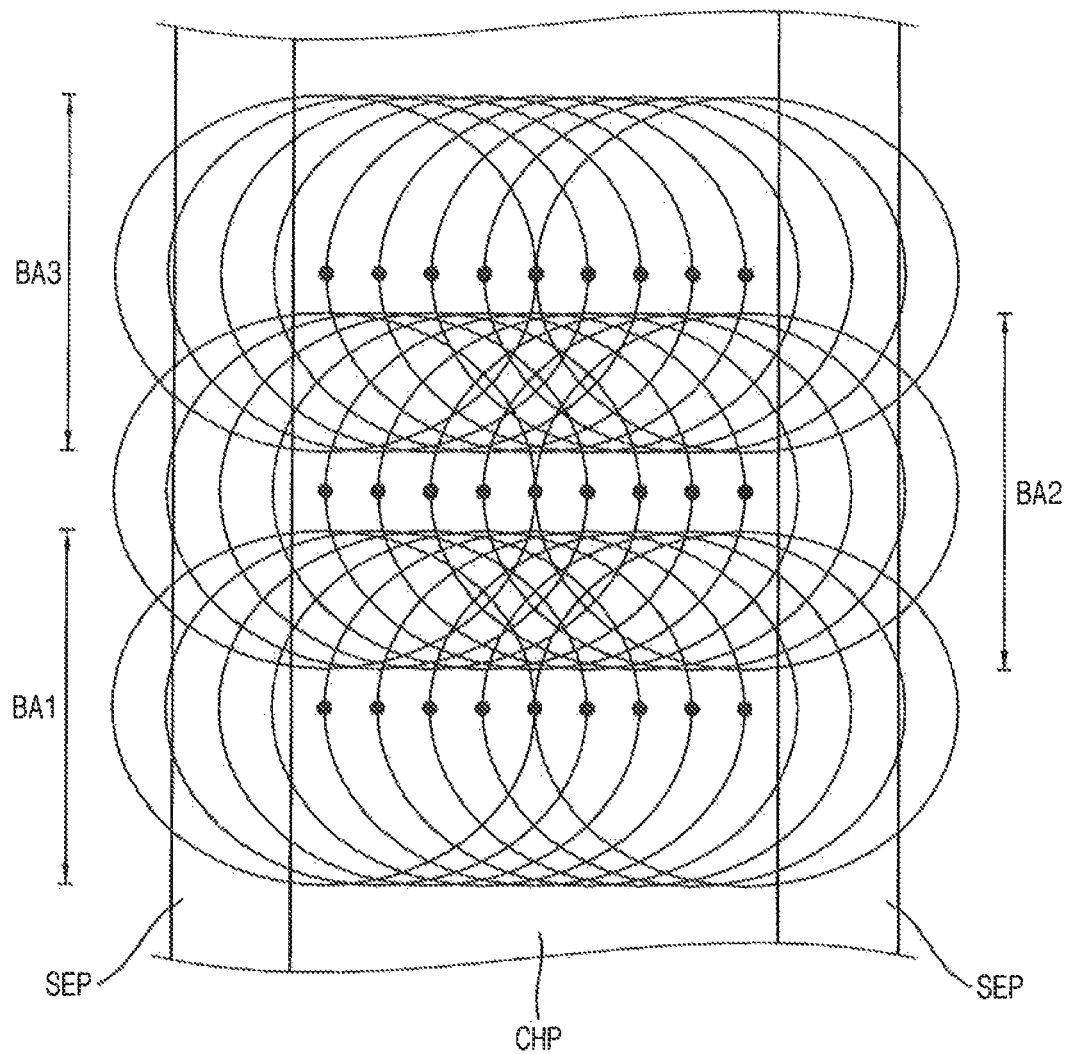
FIG. 11 is a plan view magnifying portion "A" of FIG. 10 according to an exemplary embodiment of the present inventive concept.
Figure 12:
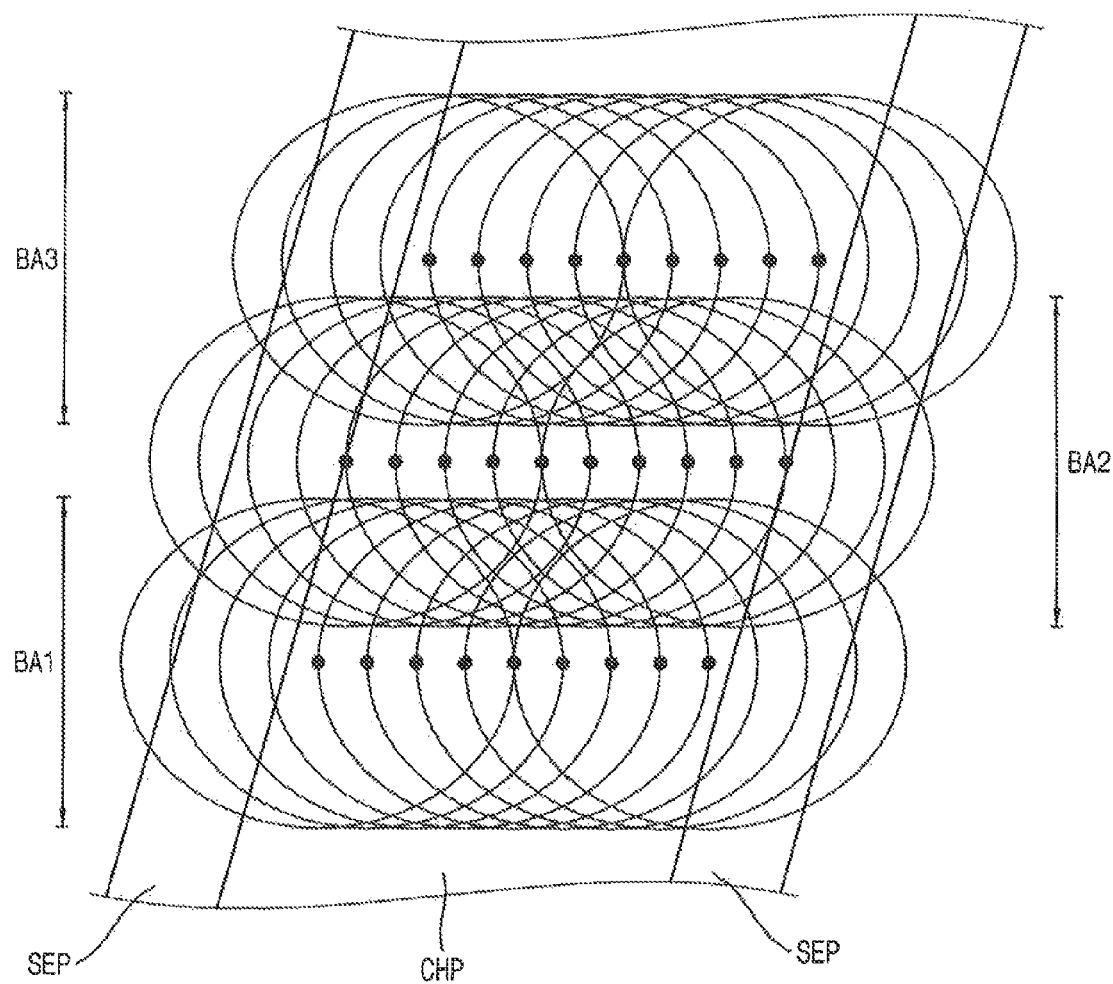
FIG. 12 is a plan view magnifying portion "B" of FIG. 5 according to an exemplary embodiment of the present inventive concept.

FIG. 10 is a plan view illustrating a source electrode, a drain electrode and a channel portion of a graphic data system file extending in a direction parallel with a scan direction SD of an exposure head according to an exemplary embodiment of the present inventive concept. FIG. 11 is a plan view magnifying portion "A" of FIG. 10 according to an exemplary embodiment of the present inventive concept. FIG. 12 is a plan view magnifying portion "B" of FIG. 5 according to an exemplary embodiment of the present inventive concept.

Referring to FIGS. 10 to 12, the source electrode pattern SEP, the drain electrode pattern DEP and the channel portion pattern CHP of the graphic data system file used for the digital micro-mirror device and exposure head, and the source electrode pattern SEP, the drain electrode pattern DEP and the channel portion pattern CHP of the graphic data system file extending in the direction parallel with the scan direction SD of the exposure head are illustrated.

When the source electrode pattern, the drain electrode pattern and the channel portion pattern of the graphic data system file extend in the direction parallel with the scan direction SD of the exposure head, the number of beams exposing the channel portion pattern may be fixed in the channel portion pattern.

For example, referring to FIG. 11, a first beam area BA1 of the channel portion pattern CHP may be exposed by nine beams, a second beam area BA2 of the channel portion pattern CHP may be exposed by nine beams, and a third beam area BA3 of the channel portion pattern CHP may be exposed by nine beams. All areas of the channel portion pattern CHP may be exposed by nine beams. in other words, all areas of the channel portion pattern CHP may be exposed by a fixed number of beams. When the number of beams exposing the pattern extending in the direction parallel with the scan direction SD of the exposure head is insufficient, the number of beams exposing the pattern extending in the direction parallel with the scan direction SD of the exposure head may be insufficient across the whole pattern. When the number of beams exposing the pattern is insufficient, an amount of exposure may be insufficient. Accordingly, when the amount of exposure is insufficient, a short may occur between the source electrode and the drain electrode in the channel portion along the scan direction SD of the exposure head.

However, when the channel portion pattern CHP extends in the diagonal direction with respect to the scan direction SD of the exposure head, each area of the channel portion pattern CHP may be exposed by a non-fixed number of beams.

For example, referring to FIG. 12, the first beam area BA1 of the channel portion pattern CHP may be exposed by nine beams, the second beam area BA2 of the channel portion pattern CHP may be exposed by ten beams, and the third beam area BA3 of the channel portion pattern CHP may be exposed by nine beams. Each area of the channel portion pattern CHP may be exposed by a non-fixed number of beams. In other words, each area of the channel portion pattern CHP may be exposed by a non-fixed number of beams.

Since the number of beams exposing the channel portion pattern CHP may be different according to a beam area of the channel portion pattern CHP, the number of beams exposing the channel portion pattern CHP is not insufficient on the whole. When the number of beams exposing the pattern is not insufficient, an amount of exposure is not insufficient. Therefore, an occurrence of a short between the source electrode and the drain electrode may be reduced or prevented.

Figure 13:
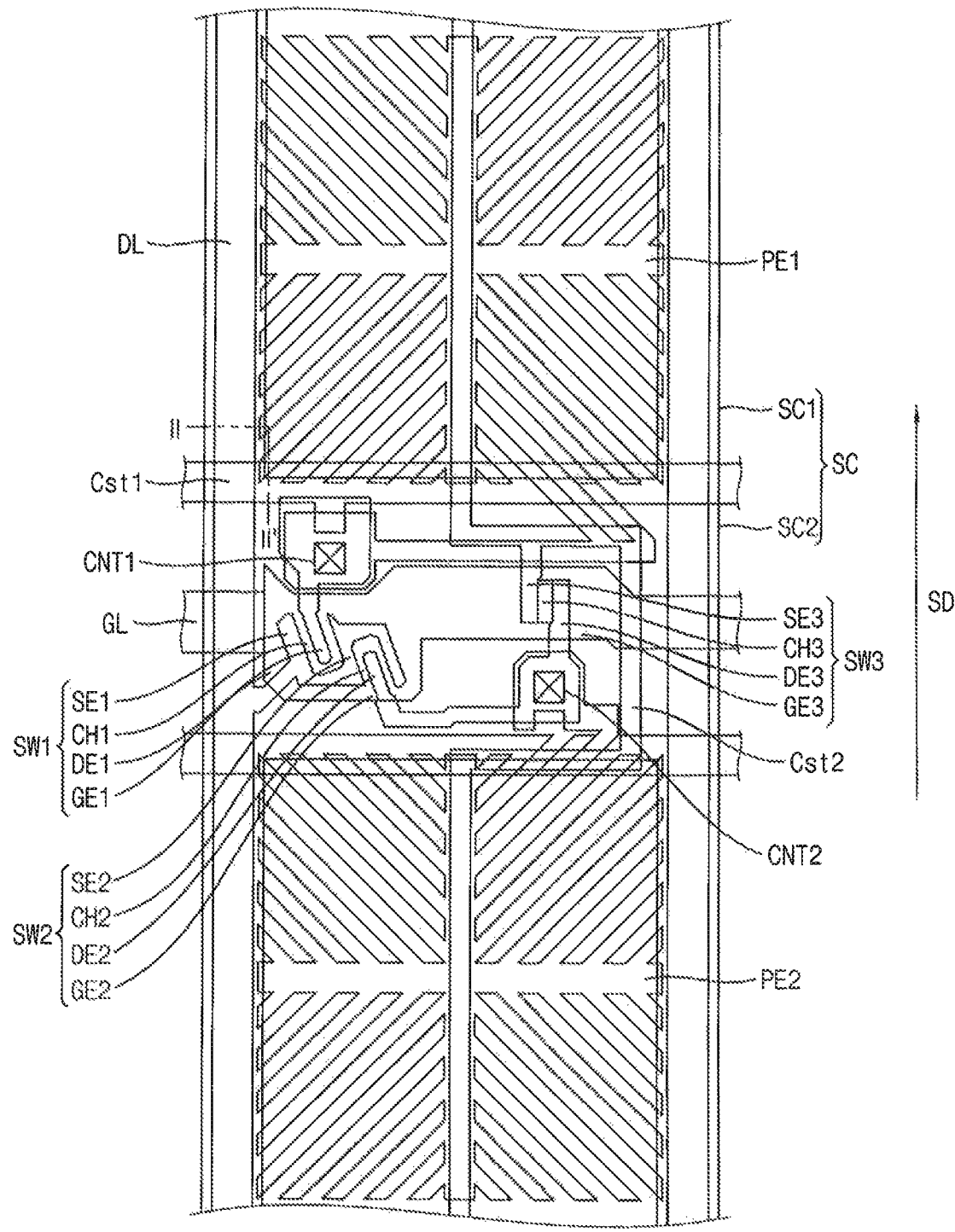
FIG. 13 is a plan view illustrating a display substrate manufactured by a maskless exposure device according to an exemplary embodiment of the present inventive concept.

FIG. 13 is a plan view illustrating a display substrate manufactured by a maskless exposure device according to an exemplary embodiment of the present inventive concept.

Referring to FIG. 13, a display substrate may include a gate line GL, a data line DL, a first storage line Cst1, a second storage line Cst2, a first switching element SW1, a second switching element SW2, a third switching element SW3, a shielding electrode SC, a high-pixel electrode PE1 and a low-pixel electrode PE2.

The gate line GL may extend in a first direction. The gate line GL may have a single layer structure including copper (Cu), silver (Ag), chromium (Cr), molybdenum (Mo), aluminum (Al), titanium (Ti), manganese (Mn) or a mixture thereof. The gate line GL may have a multi layer structure having a plurality of layers including materials different from each other. For example, the gate line GL may include a Cu layer and a Ti layer disposed on and/or under the Cu layer. The gate line GL may be electrically connected to a first gate electrode GE1 of the first switching element SW1, a second gate electrode GE2 of the second switching element SW2, and a third gate electrode GE3 of the third switching element SW3. Portions of the gate line GL may form the first gate electrode GE1, the second gate electrode GE2, and the third gate electrode GE3.

The data line DL may extend in a second direction substantially perpendicular to the first direction. The data line DL may have a single layer structure including copper (Cu), silver (Ag), chrome (Cr), molybdenum (Mo), aluminum (Al), titanium (Ti), manganese (Mn) or a mixture thereof. The data line DL may have a multi layer structure having a plurality of layers including materials different from each other. For example, the data line DL may include a Cu layer and a Ti layer disposed on and/or under the Cu layer. The data line DL may be electrically connected to a first source electrode SE1 of the first switching element SW1, and a second source electrode SE2 of the second switching element SW2.

The high-pixel electrode PE1 may be disposed adjacent to the gate line GL along the second direction, and between the first data line DL1 and the second data line DL2. The high-pixel electrode PE1 may be electrically connected to a first drain electrode DE1 of the first switching element SW1 through a first contact hole CNT1.

The low-pixel electrode PE2 may be disposed opposite to the high-pixel electrode PE1 with reference to the gate line GL, and between the first data line DL1 and the second data line DL2. The low-pixel electrode PE2 may be electrically connected to the second drain electrode DE2 of the second switching element SW2 and the third drain electrode DE3 of the third switching element SW3 through a second contact hole CNT2.

A first voltage may be applied to the high-pixel electrode PE1. A second voltage different from the first voltage may be applied to the low-pixel electrode PE2. For example, the first voltage may be higher than the second voltage, a portion of the pixel corresponding to the high-pixel electrode PE1 may be driven as a high pixel, and another portion of the pixel corresponding to the low-pixel electrode PE2 may be driven as a low pixel.

The first storage line Cst1 may extend along the first direction. The first storage line Cst1 may overlap the high-pixel electrode PE1. The first storage line Cst1 may be formed from the same layer as the gate line GL. Thus, the first storage line Cst1 may be disposed on the same layer as the gate line GL. The first storage line Cst1 may have a single layer structure including copper (Cu), silver (Ag), chrome (Cr), molybdenum (Mo), aluminum (Al), titanium (Ti), manganese (Mn) or a mixture thereof. The first storage line Cst1 may have a multi layer structure having a plurality of layers including materials different from each other. For example, the first storage line Cst1 may include a Cu layer and a Ti layer disposed on and/or under the Cu layer.

The second storage line Cst2 may be formed from the same layer as the data line DL. Thus, the second storage line Cst2 may be disposed on the same layer as the data line DL. The second storage line Cst2 may have a single layer structure including copper (Cu), silver (Ag), chrome (Cr), molybdenum (Mo), aluminum (Al), titanium (Ti), manganese (Mn) or a mixture thereof. The second storage line Cst2 may have a multi layer structure having a plurality of layers including materials different from each other. For example, the second storage line Cst2 may include a Cu layer and a Ti layer disposed on and/or under the Cu layer. The second storage line Cst2 may be electrically connected to a third source electrode SE3 of the third switching element SW3.

An insulation layer may be disposed on the data line DL and the second storage line Cst2. The insulation layer may include an inorganic material such as silicon oxide (SiOx) and/or silicon nitride (SiNx). For example, the insulation layer may include silicon oxide (SiOx), and may have a thickness of about 500 Å. The insulation layer may include a plurality of layers including materials different from each other.

An organic layer may be disposed on the insulation layer. The organic layer may be planarized on an upper surface of the display substrate 100, so that disconnection of a signal line due to a step may be reduced or prevented. The organic layer may be an insulation layer including an organic material. For example, the organic layer may be a color filter layer.

The shielding electrode SC may be disposed on the organic layer. The shielding electrode SC may include a first portion SC1 overlapping the data line DL and a second portion SC2 overlapping the gate line GL.

The shielding electrode SC may include a transparent conductive material, such as indium tin oxide (ITO), or indium zinc oxide (IZO). In addition, the shielding electrode SC may include titanium (Ti) and/or molybdenum titanium (MoTi).

The first portion SC1 of the shielding electrode SC may overlap the data line DL. The first portion SC1 may extend in the second direction. A width of the first portion SC1 may be wider than a width of the second portion SC2. The first portion SC1 of the shielding electrode SC may overlap an edge of the pixel electrode PE.

The second portion SC2 of the shielding electrode SC may overlap the gate line GL. The second portion SC2 may entirely overlap a region between pixel electrodes adjacent to each other in the second direction. The second direction may overlap with an edge of the pixel electrode PE.

A passivation layer may be disposed on the shielding electrode SC. The passivation layer may include an inorganic material such as silicon oxide (SiOx) and/or silicon nitride (SiNx). For example, the passivation layer may include silicon oxide (SiOx), and may have a thickness of about 500 Å. In addition, the passivation layer may include a plurality of layers including materials different from each other.

A pixel electrode may be disposed on the passivation layer. The pixel electrode may include the high-pixel electrode PE1 and the low-pixel electrode PE2.

The first switching element SW1 may includes the first gate electrode GE1, the first source electrode SE1, the first drain electrode DE1 and a first channel portion CH1 connecting the first source electrode SE1 to the first drain electrode DE1.

The first channel portion CH1 may include a semiconductor layer including amorphous silicon (a-Si:H) and an ohmic contact layer including n+ amorphous silicon (n+ a-Si:H). In addition, the first channel portion CH1 may include an oxide semiconductor. The oxide semiconductor may include an amorphous oxide including indium (In), zinc (Zn), gallium (Ga), tin (Sn) and/or hafnium (Hf).

The second switching element SW2 may include the second gate electrode GE2, the second source electrode SE2, the second drain electrode DE2 and a second channel portion CH2 connecting the second source electrode SE2 to the second drain electrode DE2.

The second channel portion CH2 may include a semiconductor layer including amorphous silicon (a-Si:H) and an ohmic contact layer including n+ amorphous silicon (n+ a-Si:H). In addition, the second channel portion CH2 may include an oxide semiconductor. The oxide semiconductor may include an amorphous oxide including indium (In), zinc (Zn), gallium (Ga), tin (Sn) and/or hafnium (Hf).

The third switching element SW3 may include the third gate electrode GE3, the third source electrode SE3, the third drain electrode DE3 and a third channel portion CH3 connecting the third source electrode SE3 to the third drain electrode DE3.

The third channel portion CH3 may include a semiconductor layer including amorphous silicon (a-Si:H) and an ohmic contact layer including n+ amorphous silicon (n+ a-Si:H). In addition, the third channel portion CH3 may include an oxide semiconductor. The oxide semiconductor may include an amorphous oxide including indium (In), zinc (Zn), gallium (Ga), tin (Sn) and/or hafnium (Hf).

According to an exemplary embodiment of the present inventive concept, the data line DL may extend in a direction parallel with the scan direction SD of the exposure head. The first drain electrode DE1, the second drain electrode DE2, the first source electrode SE1 and the second source electrode SE2 may extend in the diagonal direction with respect to an extension direction of the data line DL.

A switching element according to an exemplary embodiment of the present inventive concept may have a shape corresponding to a pattern of the graphic data system file according to an exemplary embodiment of the present inventive concept. For example, the first drain electrode DE1, the second drain electrode DE2, the first source electrode SE1 and the second source electrode SE2 may extend in the diagonal direction with respect to the extension direction of the data line DL.

Figure 14:
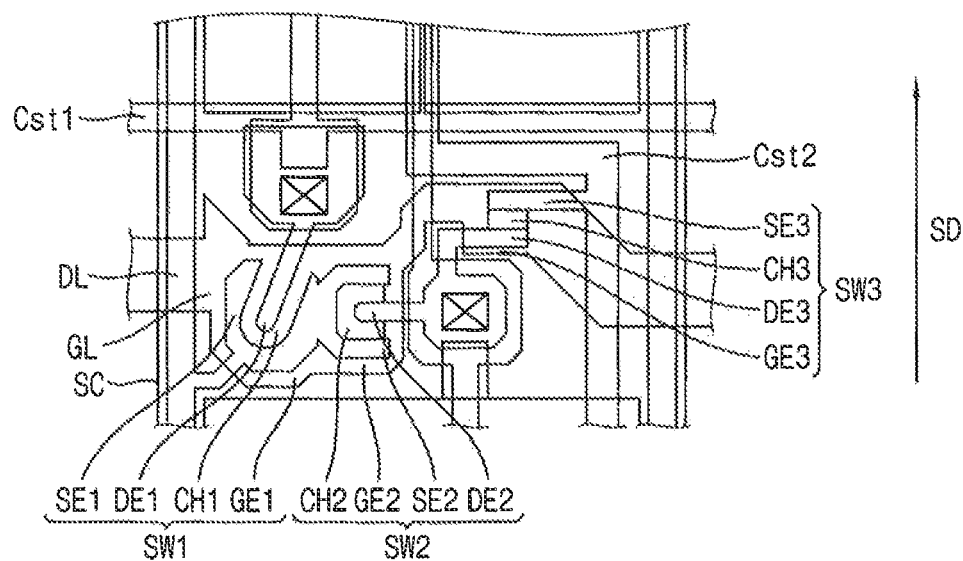
FIG. 14 is a plan view illustrating a switching element of a display substrate manufactured by a maskless exposure device according to an exemplary embodiment of the present inventive concept.

FIG. 14 is a plan view illustrating a switching element of a display substrate manufactured by a maskless exposure device according to an exemplary embodiment of the present inventive concept.

Referring to FIG. 14, the display substrate may include the gate line GL, the data line DL, the first switching element SW1, the second switching element SW2, the third switching element SW3 and the shielding electrode SC.

The first switching element SW1 may include the first gate electrode GE1, the first source electrode SE1, the first drain electrode DE1 and a first channel portion CH1 connecting the first source electrode SE1 to the first drain electrode DE1.

The first source electrode SE1 of the first switching element SW1 may be electrically connected to the data line DL. The first gate electrode GE1 of the first switching element SW1 may be electrically connected to the gate line GL. The first drain electrode DE1 of the first switching element SW1 may be electrically connected to the high pixel electrode (see, e.g., PE1 of FIG. 13).

The first channel portion CH1 may include a semiconductor layer including amorphous silicon (a-Si:H) and an ohmic contact layer including n+ amorphous silicon (n+ a-Si:H). In addition, the first channel portion CH1 may include an oxide semiconductor. The oxide semiconductor may include an amorphous oxide including indium (In), zinc (Zn), gallium (Ga), tin (Sn) and/or hafnium (Hf).

The second switching element SW2 may include the second gate electrode GE2, the second source electrode SE2, the second drain electrode DE2 and a second channel portion CH2 connecting the second source electrode SE2 to the second drain electrode DE2.

The second source electrode SE2 of the second switching element SW2 may be electrically connected to the data line DL. The second gate electrode GE2 of the second switching element SW2 may be electrically connected to the gate line GL. The second drain electrode DE2 of the second switching element SW2 may be electrically connected to the low pixel electrode (see, e.g., PE2 of FIG. 13).

The second channel portion CH2 may include a semiconductor layer including amorphous silicon (a-Si:H) and an ohmic contact layer including n+ amorphous silicon (n+ a-Si:H). In addition, the second channel portion CH2 may include an oxide semiconductor. The oxide semiconductor may include an amorphous oxide including indium (In), zinc (Zn), gallium (Ga), tin (Sn) and/or hafnium (Hf).

The third switching element SW3 may include the third gate electrode GE3, the third source electrode SE3, the third drain electrode DE3 and a third channel portion CH3 connecting the third source electrode SE3 to the third drain electrode DE3.

The third source electrode SE3 of the third switching element SW3 may be electrically connected to the data line DL. The third gate electrode GE3 of the third switching element SW3 may be electrically connected to the gate line GL. The third drain electrode DE3 of the third switching element SW3 may be electrically connected to the low pixel electrode (see, e.g., PE2 of FIG. 13).

The third channel portion CH3 may include a semiconductor layer including amorphous silicon (a-Si:H) and an ohmic contact layer including n+ amorphous silicon (n+ a-Si:H). In addition, the third channel portion CH3 may include an oxide semiconductor. The oxide semiconductor may include an amorphous oxide including indium (In), zinc (Zn), gallium (Ga), tin (Sn) and/or hafnium (Hf).

According to an exemplary embodiment of the present inventive concept, the data line DL may extend in the direction parallel with the scan direction SD of the exposure head. The first drain electrode DE1 and the first source electrode SE1 may extend in the diagonal direction with respect to the extension direction of the data line DL. The first channel portion CH1 may have a "U" shape in a plan view. The first channel portion CH1 may be bent and may have an oval shape in a plan view.

A switching element according to an exemplary embodiment of the present inventive concept may have a shape corresponding to a pattern of the graphic data system file according to an exemplary embodiment of the present inventive concept. For example, the first drain electrode DE1 and the first source electrode SE1 may extend in the diagonal direction with respect to the extension direction of the data line DL.

Figure 15:
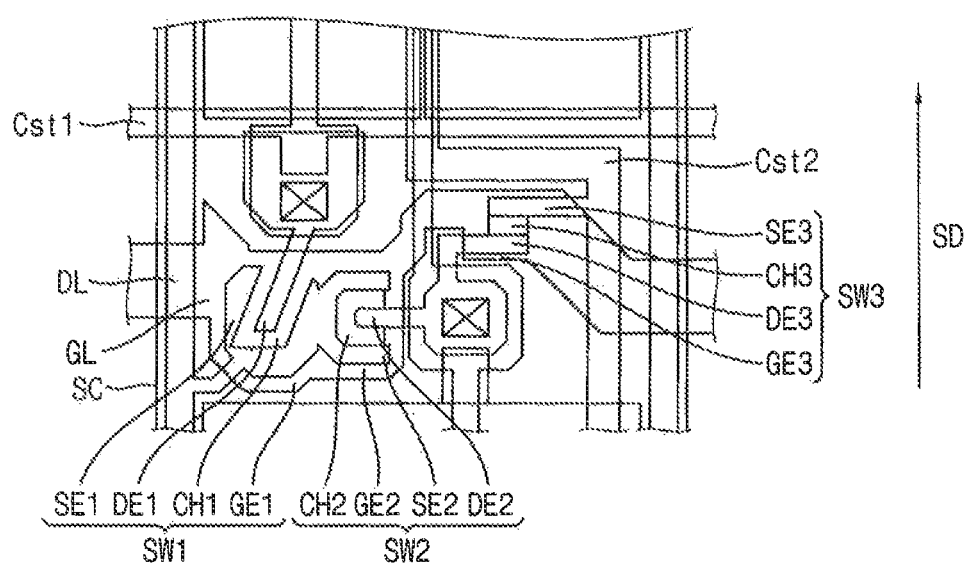
FIG. 15 is a plan view illustrating a switching element of a display substrate manufactured by a maskless exposure device according to an exemplary embodiment of the present inventive concept.

FIG. 15 is a plan view illustrating a switching element of a display substrate manufactured by a maskless exposure device according to an exemplary embodiment of the present inventive concept.

Referring to FIG. 15, the display substrate may include the gate line GL, the data line DL, the first switching element SW1, the second switching element SW2, the third switching element SW3 and the shielding electrode SC.

The first switching element SW1 may include the first gate electrode GE1, the first source electrode SE1, the first drain electrode DE1 and the first channel portion CH1 connecting the first source electrode SE1 to the first drain electrode DE1.

The first source electrode SE1 of the first switching element SW1 may be electrically connected to the data line DL. The first gate electrode GE1 of the first switching element SW1 may be electrically connected to the gate line GL. The first drain electrode DE1 of the first switching element SW1 may be electrically connected to the high pixel electrode (see, e.g., PE1 of FIG. 13).

The first channel portion CH1 may include a semiconductor layer including amorphous silicon (a-Si:H) and an ohmic contact layer including n+ amorphous silicon (n+ a-Si:H). In addition, the first channel portion CH1 may include an oxide semiconductor. The oxide semiconductor may include an amorphous oxide including indium (In), zinc (Zn), gallium (Ga), tin (Sn) and/or hafnium (Hf).

The second switching element SW2 may include the second gate electrode GE2, the second source electrode SE2, the second drain electrode DE2 and a second channel portion CH2 connecting the second source electrode SE2 to the second drain electrode DE2.

The second source electrode SE2 of the second switching element SW2 may be electrically connected to the data line DL. The second gate electrode GE2 of the second switching element SW2 may be electrically connected to the gate line GL. The second drain electrode DE2 of the second switching element SW2 may be electrically connected to the low pixel electrode (see, e.g., PE2 of FIG. 13).

The second channel portion CH2 may include a semiconductor layer including amorphous silicon (a-Si:H) and an ohmic contact layer including n+ amorphous silicon (n+ a-Si:H). In addition, the second channel portion CH2 may include an oxide semiconductor. The oxide semiconductor may include an amorphous oxide including indium (In), zinc (Zn), gallium (Ga), tin (Sn) and/or hafnium (Hf).

The third switching element SW3 may include the third gate electrode GE3, the third source electrode SE3, the third drain electrode DE3 and a third channel portion CH3 connecting the third source electrode SE3 to the third drain electrode DE3.

The third source electrode SE3 of the third switching element SW3 may be electrically connected to the data line DL. The third gate electrode GE3 of the third switching element SW3 may be electrically connected to the gate line GL. The third drain electrode DE3 of the third switching element SW3 may be electrically connected to the low pixel electrode (see, e.g., PE2 of FIG. 13).

The third channel portion CH3 may include a semiconductor layer including amorphous silicon (a-Si:H) and an ohmic contact layer including n+ amorphous silicon (n+ a-Si:H). In addition, the third channel portion CH3 may include an oxide semiconductor. The oxide semiconductor may include an amorphous oxide including indium (In), zinc (Zn), gallium (Ga), tin (Sn) and/or hafnium (Hf).

According to an exemplary embodiment of the present inventive concept, the data line DL may extend in the direction parallel with the scan direction SD of the exposure head. The first drain electrode DE1 and the first source electrode SE1 may extend in the diagonal direction with respect to the extension direction of the data line DL. The first channel portion CH1 may have a "U" shape in a plan view. The first channel portion CH1 may be bent and may have a quadrangular shape in a plan view.

A switching element according to an exemplary embodiment of the present inventive concept may have a shape corresponding to the pattern of the graphic data system file according to an exemplary embodiment of the present inventive concept. For example, the first drain electrode DE1 and the first source electrode SE1 may extend in the diagonal direction with respect to the extension direction of the data line DL.

Figure 16:
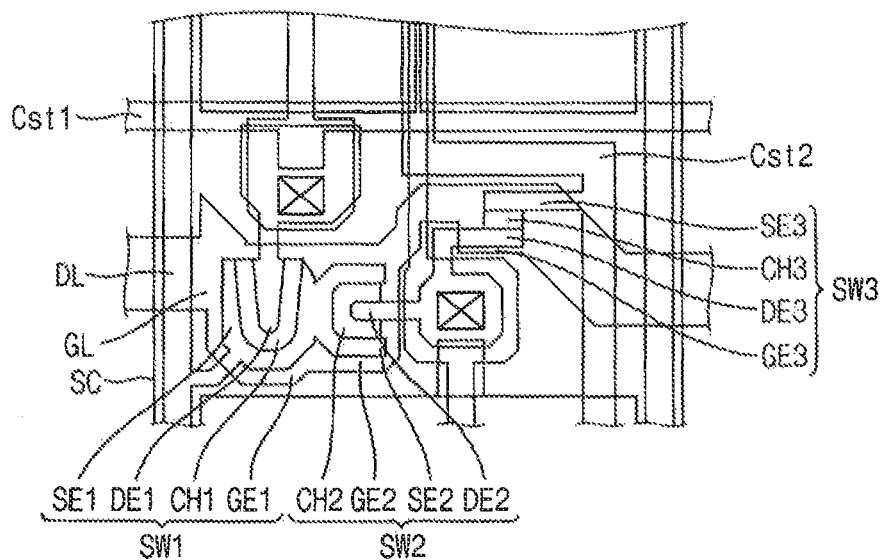
FIG. 16 is a plan view illustrating a switching element of a display substrate manufactured by a maskless exposure device according to an exemplary embodiment of the present inventive concept.

FIG. 16 is a plan view illustrating a switching element of a display substrate manufactured by a maskless exposure device according to an exemplary embodiment of the present inventive concept.

Referring to FIG. 16, the display substrate may include the gate line GL, the data line DL, the first switching element SW1, the second switching element SW2, the third switching element SW3 and the shielding electrode SC.

The first switching element SW1 may include the first gate electrode GE1, the first source electrode SE1, the first drain electrode DE1 and a first channel portion CH1 connecting the first source electrode SE1 to the first drain electrode DE1.

The first source electrode SE1 of the first switching element SW1 may be electrically connected to the data line DL. The first gate electrode GE1 of the first switching element SW1 may be electrically connected to the gate line GL. The first drain electrode DE1 of the first switching element SW1 may be electrically connected to the high pixel electrode (see, e.g., PE1 of FIG. 13).

The first channel portion CH1 may include a semiconductor layer including amorphous silicon (a-Si:H) and an ohmic contact layer including n+ amorphous silicon (n+ a-Si:H). In addition, the first channel portion CH1 may include an oxide semiconductor. The oxide semiconductor may include an amorphous oxide including indium (In), zinc (Zn), gallium (Ga), tin (Sn) and/or hafnium (Hf).

The second switching element SW2 may include the second gate electrode GE2, the second source electrode SE2, the second drain electrode DE2 and a second channel portion CH2 connecting the second source electrode SE2 to the second drain electrode DE2.

The second source electrode SE2 of the second switching element SW2 may be electrically connected to the data line DL. The second gate electrode GE2 of the second switching element SW2 may be electrically connected to the gate line GL. The second drain electrode DE2 of the second switching element SW2 may be electrically connected to the low pixel electrode (see, e.g., PE2 of FIG. 13).

The second channel portion CH2 may include a semiconductor layer including amorphous silicon (a-Si:H) and an ohmic contact layer including n+ amorphous silicon (n+ a-Si:H). In addition, the second channel portion CH2 may include an oxide semiconductor. The oxide semiconductor may include an amorphous oxide including indium (In), zinc (Zn), gallium (Ga), tin (Sn) and/or hafnium (Hf).

The third switching element SW3 may include the third gate electrode GE3, the third source electrode SE3, the third drain electrode DE3 and a third channel portion CH3 connecting the third source electrode SE3 to the third drain electrode DE3.

The third source electrode SE3 of the third switching element SW3 may be electrically connected to the data line DL. The third gate electrode GE3 of the third switching element SW3 may be electrically connected to the gate line GL. The third drain electrode DE3 of the third switching element SW3 may be electrically connected to the low pixel electrode (see, e.g., PE2 of FIG. 13).

The third channel portion CH3 may include a semiconductor layer including amorphous silicon (a-Si:H) and an ohmic contact layer including n+ amorphous silicon (n+ a-Si:H). In addition, the third channel portion CH3 may include an oxide semiconductor. The oxide semiconductor may include an amorphous oxide including indium (In), zinc (Zn), gallium (Ga), tin (Sn) and/or hafnium (Hf).

According to an exemplary embodiment of the present inventive concept, the data line DL may extend in the direction parallel with the scan direction of the exposure head. The first drain electrode DE1 and the first source electrode SE1 may extend in the diagonal direction with respect to the extension direction of the data line DL. The first channel portion CH1 may have a "U" shape in a plan view. The first channel portion CH1 may be bent and may have an oval shape in a plan view. The first channel portion CH1 may have two branches inclined at different angles with respect to the extension direction of the data line DL.

A switching element according to an exemplary embodiment of the present inventive concept may have a shape corresponding to the pattern of the graphic data system file according to an exemplary embodiment of the present inventive concept. For example, the first drain electrode DE1 and the first source electrode SE1 may extend in the diagonal direction with respect to the extension direction of the data line DL.

Figure 17:
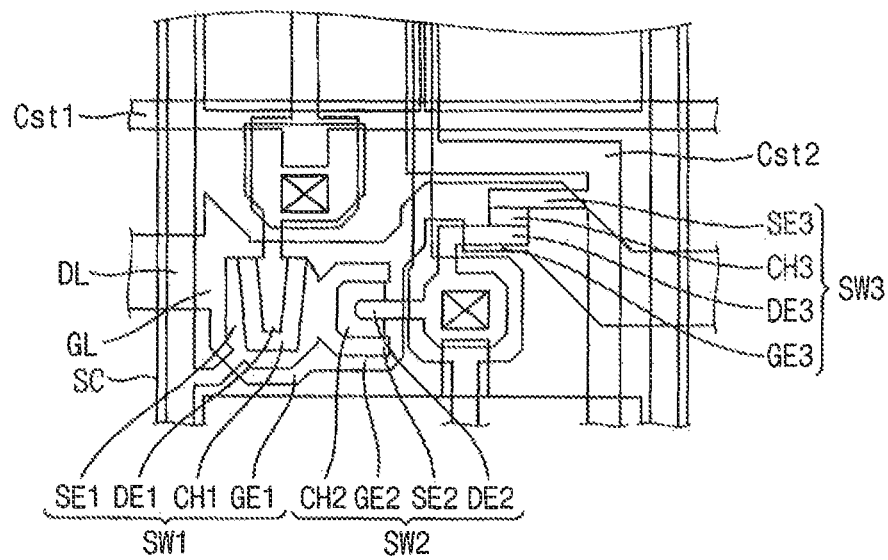
FIG. 17 is a plan view illustrating a switching element of a display substrate manufactured by a maskless exposure device according to an exemplary embodiment of the present inventive concept.

FIG. 17 is a plan view illustrating a switching element of a display substrate manufactured by a maskless exposure device according to an exemplary embodiment of the present inventive concept.

Referring to FIG. 17, the display substrate may include the gate line GL, the data line DL, the first switching element SW1, the second switching element SW2, the third switching element SW3 and the shielding electrode SC.

The first switching element SW1 may include the first gate electrode GE1, the first source electrode SE1, the first drain electrode DE1 and the first channel portion CH1 connecting the first source electrode SE1 to the first drain electrode DE1.

The first source electrode SE1 of the first switching element SW1 may be electrically connected to the data line DL. The first gate electrode GE1 of the first switching element SW1 may be electrically connected to the gate line GL. The first drain electrode DE1 of the first switching element SW1 may be electrically connected to the high pixel electrode (see, e.g., PE1 of FIG. 13).

The first channel portion CH1 may include a semiconductor layer including amorphous silicon (a-Si:H) and an ohmic contact layer including n+ amorphous silicon (n+ a-Si:H). In addition, the first channel portion CH1 may include an oxide semiconductor. The oxide semiconductor may include an amorphous oxide including indium (In), zinc (Zn), gallium (Ga), tin (Sn) and/or hafnium (Hf).

The second switching element SW2 may include the second gate electrode GE2, the second source electrode SE2, the second drain electrode DE2 and the second channel portion CH2 connecting the second source electrode SE2 to the second drain electrode DE2.

The second source electrode SE2 of the second switching element SW2 may be electrically connected to the data line DL. The second gate electrode GE2 of the second switching element SW2 may be electrically connected to the gate line GL. The second drain electrode DE2 of the second switching element SW2 may be electrically connected to a low pixel electrode (see, e.g., PE2 of FIG. 13).

The second channel portion CH2 may include a semiconductor layer including amorphous silicon (a-Si:H) and an ohmic contact layer including n+ amorphous silicon (n+ a-Si:H). In addition, the second channel portion CH2 may include an oxide semiconductor. The oxide semiconductor may include an amorphous oxide including indium (In), zinc (Zn), gallium (Ga), tin (Sn) and/or hafnium (Hf).

The third switching element SW3 may include the third gate electrode GE3, the third source electrode SE3, the third drain electrode DE3 and the third channel portion CH3 connecting the third source electrode SE3 to the third drain electrode DE3.

The third source electrode SE3 of the third switching element SW3 may be electrically connected to the data line DL. The third gate electrode GE3 of the third switching element SW3 may be electrically connected to the gate line GL. The third drain electrode DE3 of the third switching element SW3 may be electrically connected to a low pixel electrode (see, e.g., PE2 of FIG. 13).

The third channel portion CH3 may include a semiconductor layer including amorphous silicon (a-Si:H) and an ohmic contact layer including n+ amorphous silicon (n+ a-Si:H). In addition, the third channel portion CH3 may include an oxide semiconductor. The oxide semiconductor may include an amorphous oxide including indium (In), zinc (Zn), gallium (Ga), tin (Sn) and/or hafnium (Hf).

According to an exemplary embodiment of the present inventive concept, the data line DL may extend in the direction parallel with the scan direction of the exposure head. The first drain electrode DE1 and the first source electrode SE1 may extend in the diagonal direction with respect to the extension direction of the data line DL. The first channel portion CH1 may have a "U" shape in a plan view. The first channel portion CH1 may be bent and may have a quadrangular shape in a plan view. The first channel portion CH1 may have two branches inclined at different angles with respect to the extension direction of the data line DL.

A switching element according to an exemplary embodiment of the present inventive concept may have a shape corresponding to the pattern of the graphic data system file according to an exemplary embodiment of the present inventive concept. For example, the first drain electrode DE1 and the first source electrode SE1 may extend in the diagonal direction with respect to the extension direction of the data line DL.

Figure 18:
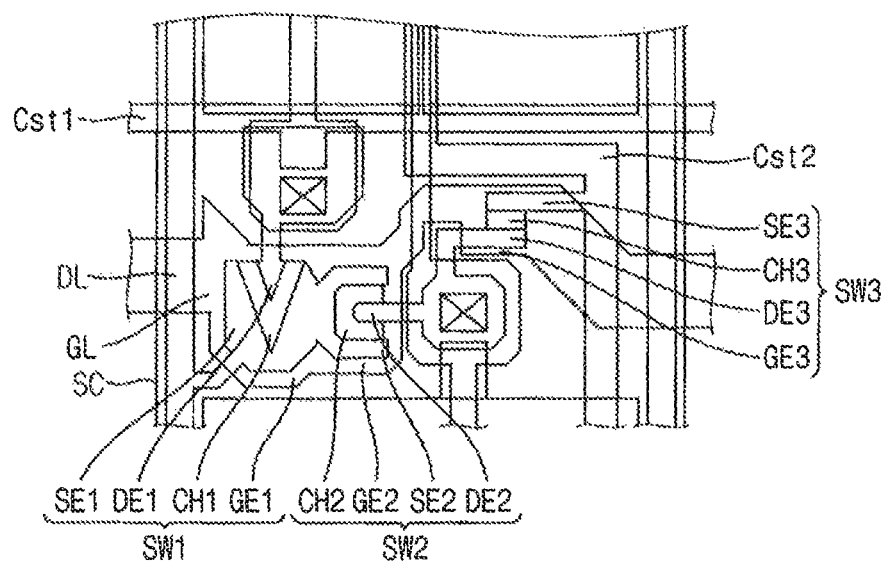
FIG. 18 is a plan view illustrating a switching element of a display substrate manufactured by a maskless exposure device according to an exemplary embodiment of the present inventive concept.

FIG. 18 is a plan view illustrating a switching element of a display substrate manufactured by a maskless exposure device according to an exemplary embodiment of the present inventive concept.

Referring to FIG. 18, the display substrate may include the gate line GL, the data line DL, the first switching element SW1, the second switching element SW2, the third switching element SW3 and the shielding electrode SC.

The first switching element SW1 may include the first gate electrode GE1, the first source electrode SE1, the first drain electrode DE1 and the first channel portion CH1 connecting the first source electrode SE1 to the first drain electrode DE1.

The first source electrode SE1 of the first switching element SW1 may be electrically connected to the data line DL. The first gate electrode GE1 of the first switching element SW1 may be electrically connected to the gate line GL. The first drain electrode DE1 of the first switching element SW1 may be electrically connected to the high pixel electrode (see, e.g., PE1 of FIG. 13).

The first channel portion CH1 may include a semiconductor layer including amorphous silicon (a-Si:H) and an ohmic contact layer including n+ amorphous silicon (n+ a-Si:H). In addition, the first channel portion CH1 may include an oxide semiconductor. The oxide semiconductor may include an amorphous oxide including indium (In), zinc (Zn), gallium (Ga), tin (Sn) and/or hafnium (Hf).

The second switching element SW2 may include the second gate electrode GE2, the second source electrode SE2, the second drain electrode DE2 and the second channel portion CH2 connecting the second source electrode SE2 to the second drain electrode DE2.

The second source electrode SE2 of the second switching element SW2 may be electrically connected to the data line DL. The second gate electrode GE2 of the second switching element SW2 may be electrically connected to the gate line GL. The second drain electrode DE2 of the second switching element SW2 may be electrically connected to the low pixel electrode (see, e.g., PE2 of FIG. 13).

The second channel portion CH2 may include a semiconductor layer including amorphous silicon (a-Si:H) and an ohmic contact layer including n+ amorphous silicon (n+ a-Si:H). In addition, the second channel portion CH2 may include an oxide semiconductor. The oxide semiconductor may include an amorphous oxide including indium (In), zinc (Zn), gallium (Ga), tin (Sn) and/or hafnium (Hf).

The third switching element SW3 may include the third gate electrode GE3, the third source electrode SE3, the third drain electrode DE3 and a third channel portion CH3 connecting the third source electrode SE3 to the third drain electrode DE3.

The third source electrode SE3 of the third switching element SW3 may be electrically connected to the data line DL. The third gate electrode GE3 of the third switching element SW3 may be electrically connected to the gate line GL. The third drain electrode DE3 of the third switching element SW3 may be electrically connected to the low pixel electrode (see, e.g., PE2 of FIG. 13).

The third channel portion CH3 may include a semiconductor layer including amorphous silicon (a-Si:H) and an ohmic contact layer including n+ amorphous silicon (n+ a-Si:H). In addition, the third channel portion CH3 may include an oxide semiconductor. The oxide semiconductor may include an amorphous oxide including indium (In), zinc (Zn), gallium (Ga), tin (Sn) and/or hafnium (Hf).

According to an exemplary embodiment of the present inventive concept, the data line DL may extend in the direction parallel with the scan direction of the exposure head. The first drain electrode DE1 and the first source electrode SE1 may extend in the diagonal direction with respect to the extension direction of the data line DL. The first channel portion CH1 may have a "V" shape in a plan view. The first channel portion CH1 may have two branches inclined at different angles with respect to the extension direction of the data line DL.

A switching element according to an exemplary embodiment of the present inventive concept may have a shape corresponding to the pattern of the graphic data system file according to an exemplary embodiment of the present inventive concept. For example, the first drain electrode DE1 and the first source electrode SE may extend in the diagonal direction with respect to the extension direction of the data line DL.

According to an exemplary embodiment of the present inventive concept, the graphic data system file may include data of the source electrode, the drain electrode and the channel portion disposed between the source electrode and the drain electrode in a plan view. The channel portion may extend in the diagonal direction with respect to the scan direction of the exposure head. Thus, each area of the channel portion may be exposed by a non-fixed number of beams. Since the number of beams exposing the channel portion may be different according to a beam area of the channel portion, the number of beams exposing the channel portion may be not insufficient on the whole.

Since the number of beams exposing the pattern is not insufficient, an amount of exposure may be not insufficient. Therefore, an occurrence of a short between the source electrode and the drain electrode may be reduced or prevented.

While the present invention has been particularly shown and described with reference to exemplary embodiments thereof, it will be understood by those of ordinary skill in the art that various changes in form and detail may be made therein without departing from the spirit and scope of the present invention, as defined by the following claims.

What is claimed is:

1. A maskless exposure device comprising:
    an exposure head comprising a digital micro-mirror device, wherein the digital micro-mirror device is configured to transmit a source beam applied from an exposure source to a substrate; and
    a system control part configured to control the digital micro-mirror device by using a graphic data system file,
    wherein the graphic data system file comprises data for forming a source electrode, a drain electrode and a channel portion disposed between the source electrode and the drain electrode, and
    wherein the graphic data system file comprises data for forming the channel portion extending in a diagonal direction with respect to a scan direction of the exposure head.

2. The maskless exposure device of claim 1, wherein the channel portion has a "U" shape in a plan view.

3. The maskless exposure device of claim 2, wherein the channel portion further comprises:
    a first extension portion extending in the diagonal direction with respect to the scan direction of the exposure head;
    a second extension portion bent from the first extension portion and extending in the diagonal direction with respect to the scan direction of the exposure head; and
    a connecting portion connecting the first extension portion and the second extension portion.

4. The maskless exposure device of claim 3, wherein the first extension portion is parallel with the second extension portion.

5. The maskless exposure device of claim 3, wherein the first extension portion is inclined at a first angle with respect to the scan direction of the exposure head, wherein the second extension portion is inclined at a second angle with respect to the scan direction of the exposure head, and wherein the second angle is different from the first angle.

6. The maskless exposure device of claim 1, wherein the channel portion has a "V" shape in a plan view.

7. The maskless exposure device of claim 1, wherein the system control part further comprises:
    a file producing part configured to produce the graphic data system file corresponding to a pattern to be formed on the substrate;
    a data outputting part configured to generate digital micro-mirror device on/off data from the graphic data system file to control on/off timing of the digital micro-mirror device; and
    a transfer control part configured to output a transfer signal, wherein the transfer signal transfers a stage configured to fix the substrate thereto.

8. The maskless exposure device of claim 7, wherein the transfer control part controls on/off timing of the exposure beam in response to the digital micro-mirror device on/off data supplied from the data outputting part, and transfers the stage.

9. A method of maskless exposure, the method comprising:
    producing a graphic data system file for forming a pattern on a substrate;
    generating digital micro-mirror device on/off data from the graphic data system file; and
    exposing the substrate in response to the digital micro-mirror device on/off data,
    wherein the graphic data system file comprises data for forming a source electrode, a drain electrode and a channel portion disposed between the source electrode and the drain electrode in a plan view, and
    wherein the graphic data system file comprises data for forming the channel portion extending in a diagonal direction with respect to a scan direction of the exposure head.

10. The method of claim 9, wherein the channel portion has a "U" shape in a plan view.

11. The method of claim 10, wherein the channel portion further comprises:
    a first extension portion extending in the diagonal direction with respect to the scan direction of the exposure head;

a second extension portion bent from the first extension portion and extending in the diagonal direction with respect to the scan direction of the exposure head; and
a connecting portion connecting the first extension portion and the second extension portion.

12. The method of claim 11, wherein the first extension portion is parallel with the second extension portion.

13. The method of claim 11, wherein the first extension portion is inclined at a first angle with respect to the scan direction of the exposure head, wherein the second extension portion is inclined at a second angle with respect to the scan direction of the exposure head, and wherein the second angle is different from the first angle.

14. The method of claim 9, wherein the channel portion has a "V" shape in a plan view.

* * * * *